United States Patent
Shizuka

(10) Patent No.: US 9,798,658 B2
(45) Date of Patent: Oct. 24, 2017

(54) MICROCOMPUTER APPARATUS, PROGRAM REWRITING SYSTEM AND NON-TRANSITORY COMPUTER-READABLE INFORMATION RECORDING MEDIUM

(71) Applicant: TOYOTA JIDOSHA KABUSHIKI KAISHA, Toyota-shi, Aichi-ken (JP)

(72) Inventor: Satoshi Shizuka, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 23 days.

(21) Appl. No.: 14/992,282

(22) Filed: Jan. 11, 2016

(65) Prior Publication Data

US 2016/0232087 A1   Aug. 11, 2016

(30) Foreign Application Priority Data

Feb. 10, 2015   (JP) ................. 2015-024466

(51) Int. Cl.
| | |
|---|---|
| G06F 12/02 | (2006.01) |
| G06F 9/445 | (2006.01) |
| G11C 16/10 | (2006.01) |
| G11C 17/18 | (2006.01) |

(52) U.S. Cl.
CPC .......... *G06F 12/0246* (2013.01); *G06F 8/665* (2013.01); *G06F 2212/7209* (2013.01); *G11C 16/105* (2013.01); *G11C 17/18* (2013.01)

(58) Field of Classification Search
None
See application file for complete search history.

(56) References Cited

U.S. PATENT DOCUMENTS

| | | |
|---|---|---|
| 6,883,060 B1 | 4/2005 | Hayama |
| 6,959,365 B2 | 10/2005 | Ootani et al. |
| 2006/0218340 A1 | 9/2006 | Fujita et al. |

FOREIGN PATENT DOCUMENTS

JP   2008-165729 A   7/2008

*Primary Examiner* — Kevin Verbrugge
(74) *Attorney, Agent, or Firm* — Oliff PLC

(57) ABSTRACT

In a first process, based on data of a FLASH status 0 area included in a first block of a flash ROM, a rewriting process including erasing, writing and verifying on blocks of the flash ROM storing a user program to be rewritten based on contents of a user program for rewriting is controlled. In a second process, the rewriting process is carried out without regard to the data of the FLASH status 0 area. In the first process, writing on the FLASH status 0 area is not carried out in the rewriting process on the first block of the flash ROM, but writing on the FLASH status 0 area is carried out based on the contents of the user program for rewriting after carrying out the rewriting process on a last block of the flash ROM.

20 Claims, 19 Drawing Sheets

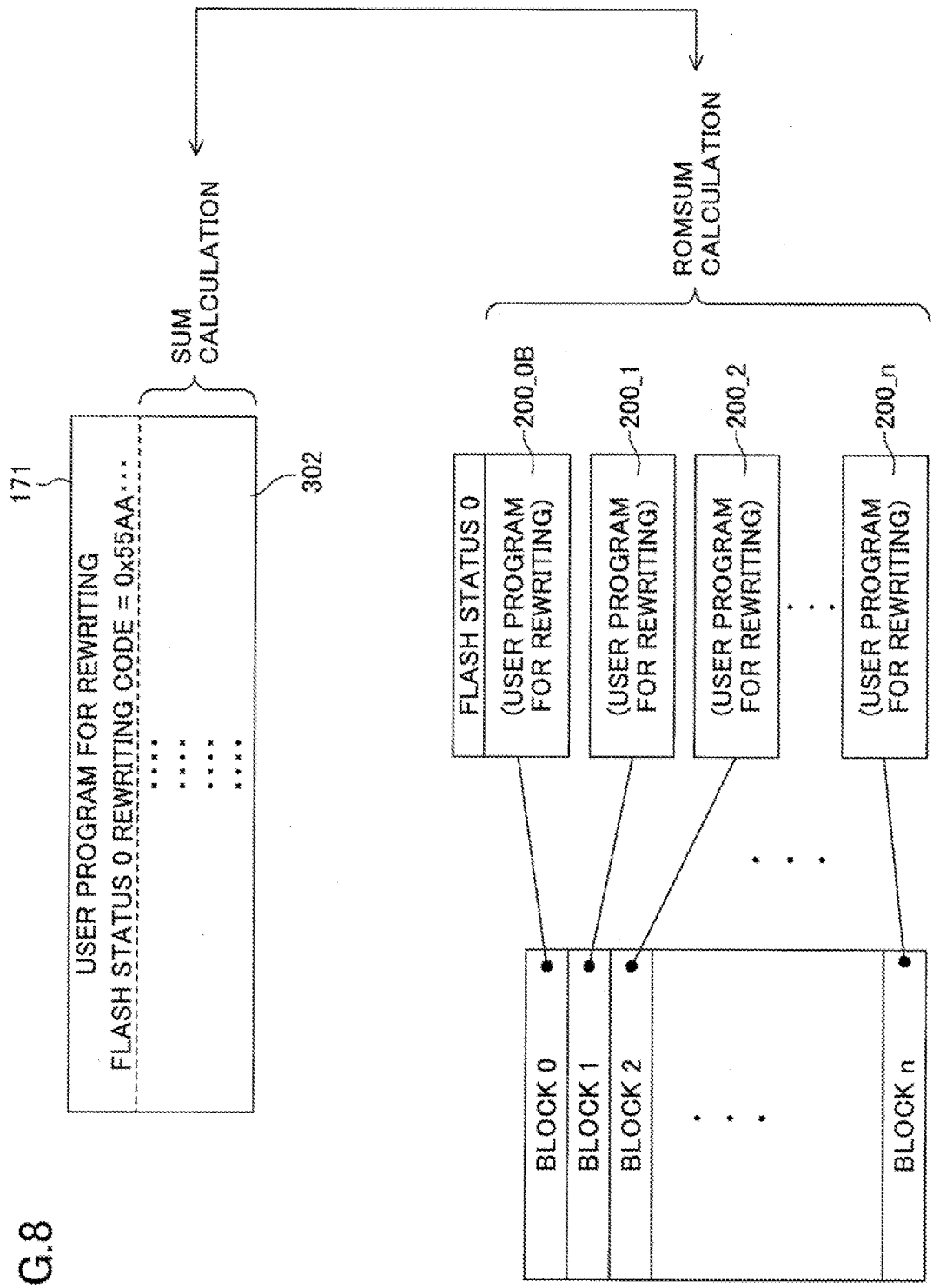

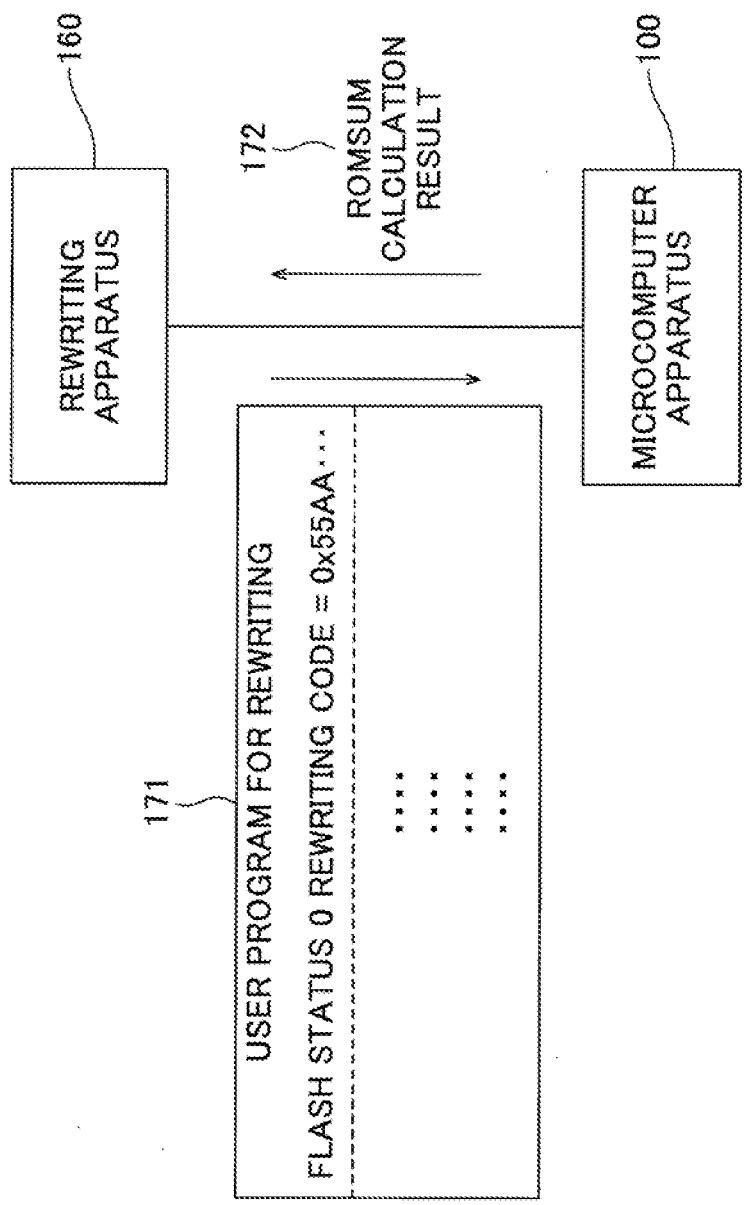

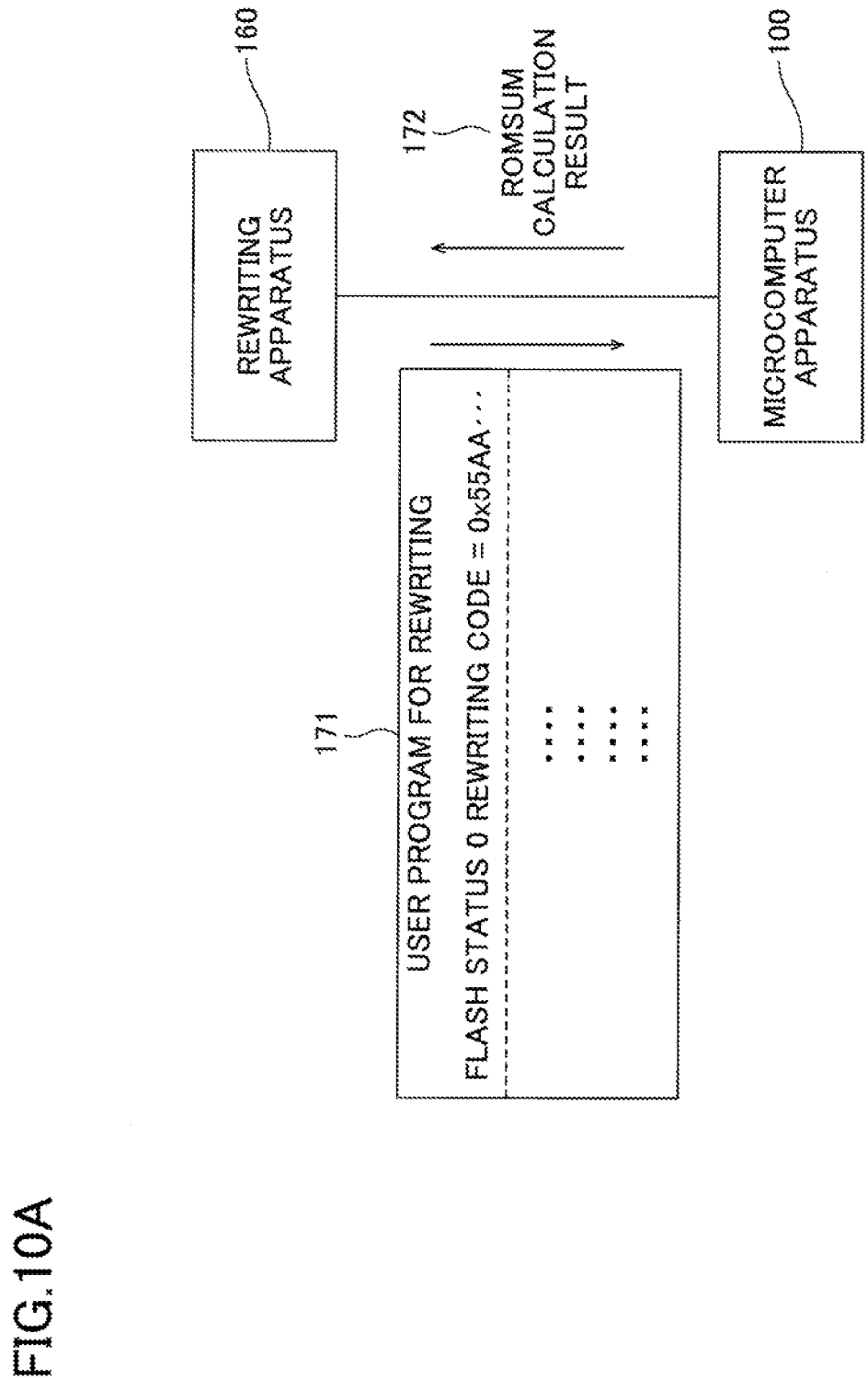

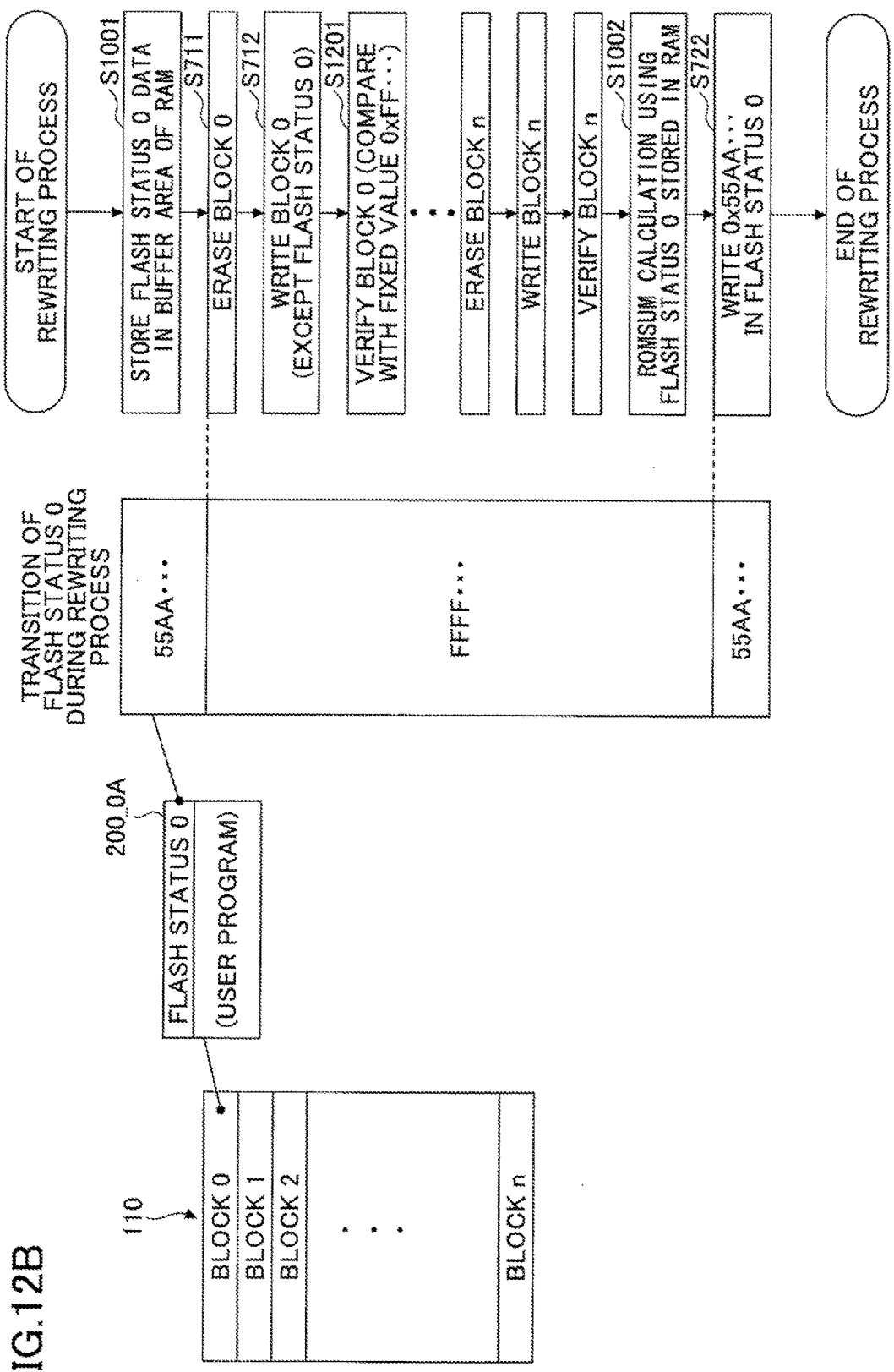

MICROCOMPUTER APPARATUS, PROGRAM REWRITING SYSTEM AND NON-TRANSITORY COMPUTER-READABLE INFORMATION RECORDING MEDIUM

The present application is based on and claims the benefit of priority of Japanese Priority Application No. 2015-024466 filed on Feb. 10, 2015, the entire contents of which are hereby incorporated herein by reference.

BACKGROUND

1. Technical Field

The present disclosure relates to a microcomputer apparatus, a program rewriting system and a non-transitory computer-readable information recording medium.

2. Description of the Related Art

According to the related art, a program for rewriting a user program (i.e., a rewriting program) is installed in a flash Read Only Memory (flash ROM) incorporated in a microcomputer apparatus, and it is possible to rewrite the user program by executing the rewriting program.

Generally speaking, such rewriting programs can be classified into two types according whether to use data written in a FLASH status 0 area (i.e., an area to be used to write a "rewriting completion code"). As respective examples thereof, general-purpose rewriting programs supplied by microcomputer manufacturers or the like and unique rewriting programs supplied by Original Equipment Manufacturers (OEM) or the like can be cited.

A unique rewriting program supplied by an OEM or the like is such a program as one controlling a user program rewriting process based on the data of the FLASH status 0 area. In such a case, it is possible to execute the rewriting program again even when an error occurs during the rewriting process.

SUMMARY

According to one aspect, a microcomputer apparatus in which a user program stored in blocks of a flash ROM is rewritable based on contents of a user program for rewriting includes one or more processors configured to carry out a first process of controlling, based on data of a FLASH status 0 area used to write a rewriting completion code included in a first block of the blocks of the flash ROM, a rewriting process including erasing, writing and verifying on the blocks of the flash ROM, and a second process of carrying out the rewriting process including erasing, writing and verifying on the blocks of the flash ROM without regard to the data of the FLASH status 0 area. In the first process, the one or more processors do not carry out writing on the FLASH status 0 area in the rewriting process on the first block of the blocks of the flash ROM, and the one or more processors carry out writing on the FLASH status 0 area based on the contents of the user program for rewriting after carrying out the rewriting process on a last block of the blocks of the flash ROM.

Other objects, features and advantages will become more apparent from the following detailed description when read in conjunction with the accompanying drawings.

BRIEF DESCRIPTION OF THE DRAWINGS

FIG. 8 schematically illustrates a ROMSUM calculation process by a ROMSUM calculation part and a SUM calculation process by a rewriting apparatus;
FIGS. 9A and 9B illustrate a rewriting process carried out by a second rewriting program according to the first embodiment;
FIGS. 10A and 10B illustrate a rewriting process carried out by a first rewriting program according to a second embodiment;
FIGS. 12A and 12B illustrate a rewriting process carried out by a first rewriting program according to a third embodiment.

DETAILED DESCRIPTION OF EMBODIMENTS

Figure 1:
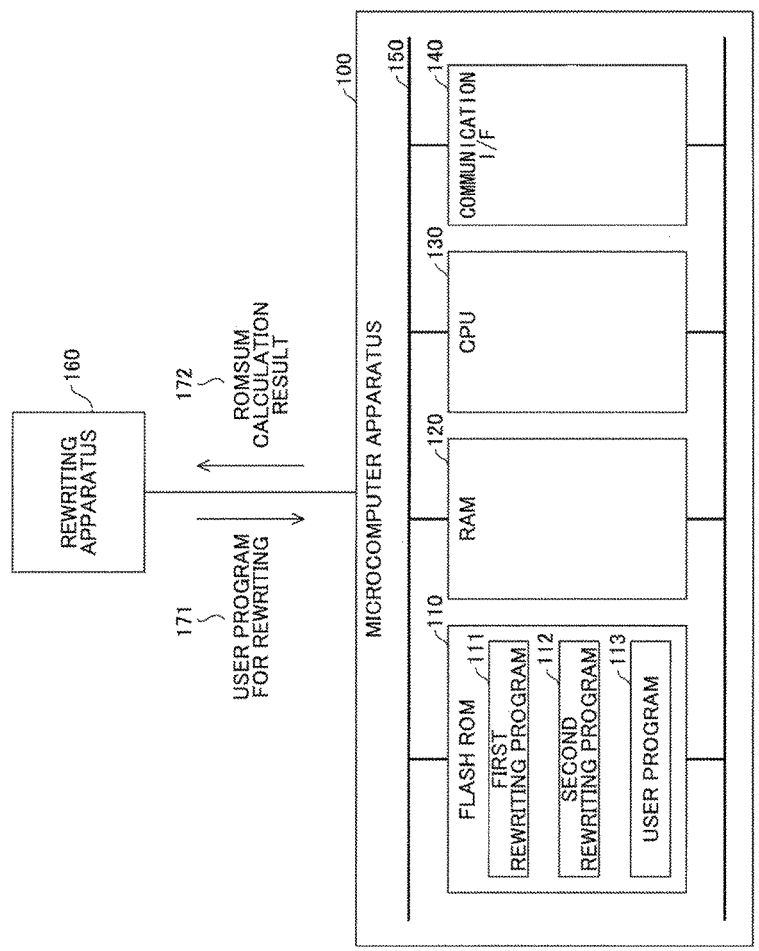
FIG. 1 illustrates a hardware configuration of a microcomputer apparatus.

When a general-purpose rewriting program and a unique rewriting program, described above, are installed in a microcomputer apparatus, a user may need to prepare respective user programs for rewriting corresponding to the two rewriting programs. That is, the two user programs for rewriting having different codes to be written in the FLASH status 0 areas may need to be prepared. This is because, in a case of a unique rewriting program, different from a general-purpose rewriting program, a rewriting process to be carried out after the code is written in the FLASH status 0 area may depend on the written code.

If it is necessary to prepare different user programs for rewriting corresponding to rewriting programs, respectively, in consideration of an influence on a rewriting process caused by a code written in the FLASH status 0 area, the user's load for managing the user programs may be heavy.

In contrast thereto, it is possible to use the same code to be written in the FLASH status 0 area, if, for example, it is possible to remove an influence on a rewriting process otherwise appearing after the code is written in the FLASH status 0 area. In other words, it is possible to share the new user program for rewriting between the above-mentioned two types of rewriting programs, and it is possible to reduce the user's managing load.

An object of the present disclosure is to reduce a load of a user who manages new user programs for rewriting.

Now, embodiments will be described by using the accompanying drawings. Note that, in the description and drawings, the same reference numerals/signs are given to elements having substantially identical functional configurations, and duplicate description will be omitted.

First Embodiment

<(1) Hardware Configuration of Microcomputer Apparatus>
First, a hardware configuration of a microcomputer apparatus according to a first embodiment will be described. FIG. 1 illustrates a hardware configuration of a microcomputer apparatus.

As shown in FIG. 1, a microcomputer apparatus 100 includes a flash ROM 110, a RAM 120, a CPU 130 and a communication I/F 140, and these parts are connected via a bus 150.

The flash ROM 110 stores a user program 113 to be executed by the CPU 130. Also, the flash ROM 110 stores a first rewriting program 111 and a second rewriting program 112 for rewriting the user program 113 into a new user program (referred to as a "user program for rewriting") 171.

Note that, below, the first rewriting program 111 is a unique rewriting program supplied by, for example, an OEM and controls a rewriting process depending on the data of the FLASH status 0 area.

The first rewriting program 111 controls a rewriting process based on the data of the FLASH status 0 area included in the first block of the flash ROM 110 to be rewritten. Note that, the rewriting process carried out by the first rewriting program 111 includes erasing, writing, and verifying on each block of the flash ROM to be rewritten.

The first rewriting program 111 carries out a ROMSUM calculation for confirming whether the user program 113 is properly rewritten based on the contents of the user program for rewriting 171, and outputs a ROMSUM calculation result 172 to a rewriting apparatus 160. Note that the ROMSUM calculation is such a calculation as to sum the data written in the respective blocks of the flash ROM 110 together, and thus, acquire the summed value.

The second rewriting program 112 is, for example, a general-purpose rewriting program supplied by, for example, a microcomputer apparatus manufacturer or the like, and carries out a rewriting process regardless of the data of the FLASH status 0 area. The second rewriting program 112 carries out a rewriting process on the blocks to be rewritten regardless of the data of the FLASH status 0 area included in the first block of the flash ROM 110 to be rewritten. Note that, a rewriting process carried out by the second rewriting program 112 includes erasing, writing, and verifying on each block of the flash ROM 110 to be rewritten.

The RAM 120 is a main storage device that provides a work area where various programs stored in the flash ROM 110 are temporarily held when they are executed by the CPU 130. The RAM 120 also provides a holding area for temporarily holding data calculated as a result of the various programs stored in the flash ROM 110 being executed by the CPU 130.

The CPU 130 is a processor which executes the various programs stored in the flash ROM 110.

The communication Interface (I/F) 140 supports protocols of communications such as serial communications such as a Universal Asynchronous Receiver Transmitter (UART), an in-vehicle Local Area Network (LAN) such as a Controller Area Network (CAN), and/or the like. The communication I/F 140 carries out communications with the rewriting apparatus 160 when the rewriting apparatus 160 supplies the user program for rewriting 171 to the microcomputer apparatus 100. Note that a combination of the rewriting apparatus 160 and the microcomputer apparatus 100 may be referred to as a "program rewriting system".

The rewriting apparatus 160 connected to the microcomputer apparatus 100 via the communication I/F 140 supplies the user program for rewriting 171 for rewriting the user program 113 stored in the flash ROM 110 to the microcomputer apparatus 100. Also, the rewriting apparatus 160 supplies such an instruction to the microcomputer apparatus 100 so as to cause it to execute the first rewriting program 111 or the second rewriting program 112. Further, the rewriting apparatus 160 receives the ROMSUM calculation result 172 calculated as a result of the first rewriting program 111 being executed, compares it with a "SUM calculation result" of the user program for rewriting 171, and thus, determines whether the rewriting has been properly carried out. Note that the "SUM calculation result" means a result of calculating the summed value acquired from summing the contents described in the user program for rewriting 171.

Note that in the above description, it has been mentioned that the rewriting apparatus 160 compares the ROMSUM calculation result 172 and the SUM calculation result, and determines whether the rewriting has been properly carried out. However, it is also possible that the microcomputer apparatus 100 carries out this process.

<(2) Configuration of Flash ROM>

Figure 2:
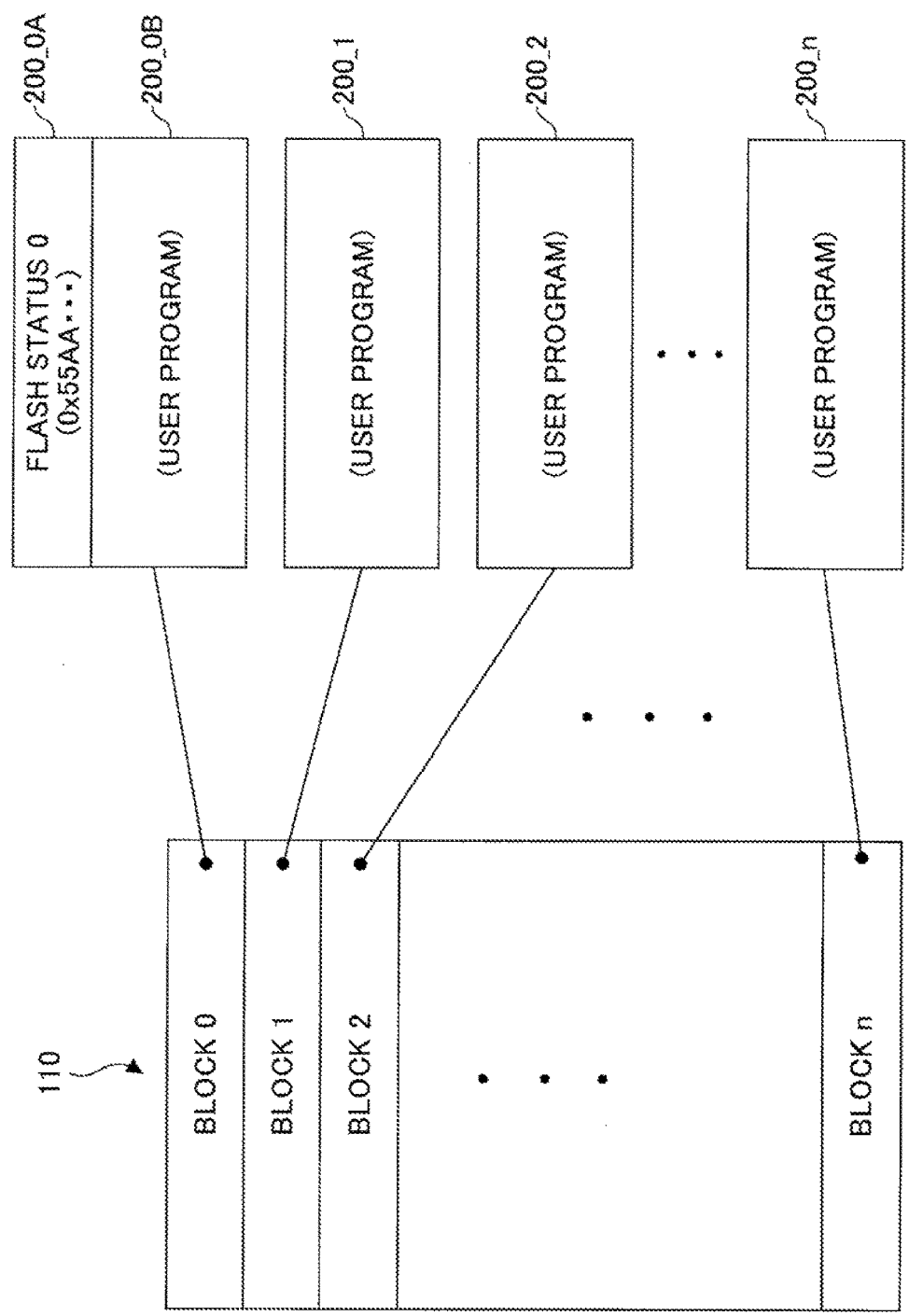
FIG. 2 illustrates a configuration of a flash ROM.

Next, the configuration of the flash ROM 110 will be described. For the purpose of convenience of explanation, hereinafter, the term "flash ROM 110" will be used to represent a particular part of the flash ROM 110 including the blocks storing the user program 113 shown in FIG. 2, although the flash ROM 110 has another part storing the first and second rewriting programs 111 and 112. FIG. 2 illustrates a configuration (memory map) of the flash ROM 110. As shown in FIG. 2, the flash ROM 110 is divided into n+1 blocks, i.e., the block 0 to block n, each having 64 kilobytes, for example.

The block 0 includes the FLASH status 0 area 200_0A to be used for writing the rewriting completion code and an area 200_0B in which a part (division) of the user program 113 is written after the user program 113 is divided into n+1 parts (divisions). The block 0 is a block on which a rewriting process is carried out first when the first rewriting program 111 or the second rewriting program 112 carries out a rewriting process. The block n is a block on which a rewriting process is carried out at the end when the first rewriting program 111 or the second rewriting program 112 carries out a rewriting process. The n blocks 1 to n include n areas 200_1 to 200_n, respectively, in which the remaining respective n parts (divisions) of the user program 113, which is written after the user program 113 is divided into the n+1 parts (divisions), are written.

Note that, according to the first embodiment, a code "0x55AA..." is written in the FLASH status 0 area 200_0A of the block 0 as the rewriting completion code.

<(3) User Program for Rewriting>

Figure 3:
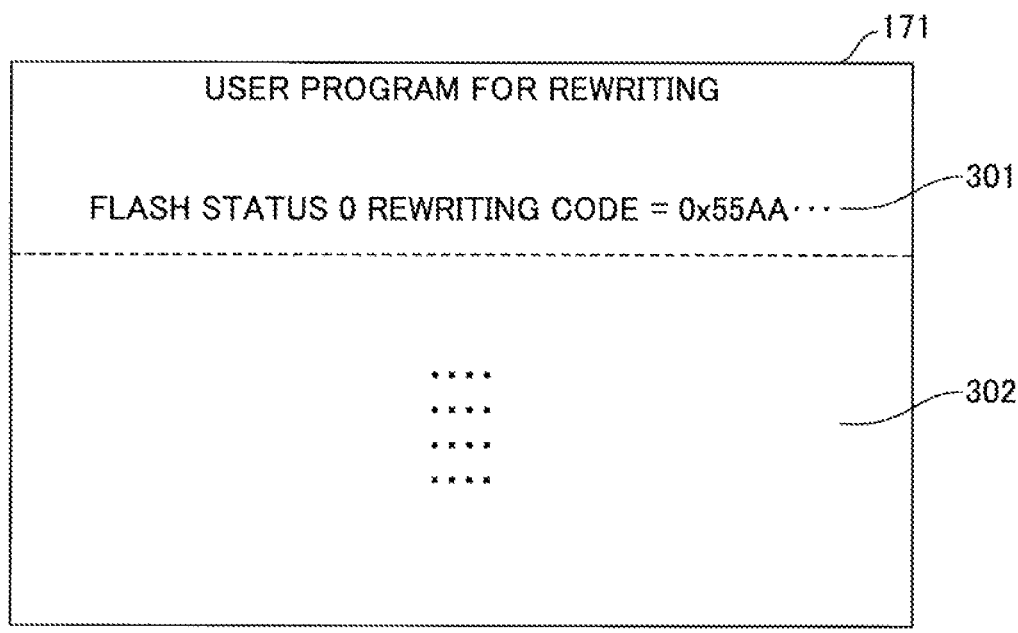
FIG. 3 illustrates one example of a user program for rewriting.

Next, the user program for rewriting 171 supplied by the rewriting apparatus 160 will be described. FIG. 3 illustrates one example of the user program for rewriting 171. As shown in FIG. 3, the user program for rewriting 171 has a rewriting code area 301 in which a "rewriting code" that is written in the FLASH status 0 area 200_0A when a rewriting process is carried out on the flash ROM 110 is recorded; and a body area 302 in which a program body is recorded.

According to the first embodiment, as the rewriting code that is written in the FLASH status 0 area 200_0A when a rewriting process is carried out, the code "0x55AA..." is used. In other words, according to the first embodiment, as the user program for rewriting 171, a program having the code same as the "rewriting completion code" that is recorded in the rewriting code area 301 is used.

As the rewriting apparatus 160 supplies the user program for rewriting 171, and, when a rewriting process is carried out in the microcomputer apparatus 100, the microcomputer apparatus 100 writes the rewriting code recorded in the rewriting code area 301 in the FLASH status 0 area 200_0A of the block 0 of the flash ROM 110. The microcomputer apparatus 100 writes the program body recorded in the body area 302 of the user program for rewriting 171 in the area 200_0B and the areas 200_1 to 200_n of the total n+1 blocks, i.e., the block 0 to the block n, in a manner of dividing the program body into the corresponding n+1 divisions.

<(4) First and Second Process Parts>

Next, a first process part 410 implemented as a result of the first rewriting program 111 being executed by the CPU 130 and a second process part 420 implemented as a result of the second rewriting program 112 being executed by the CPU 130 will be described. Note that a process carried out by the first process part 410 may be referred to as a first process, and a process carried out by the second process part 420 may be referred to as a second process.

Figure 4A:
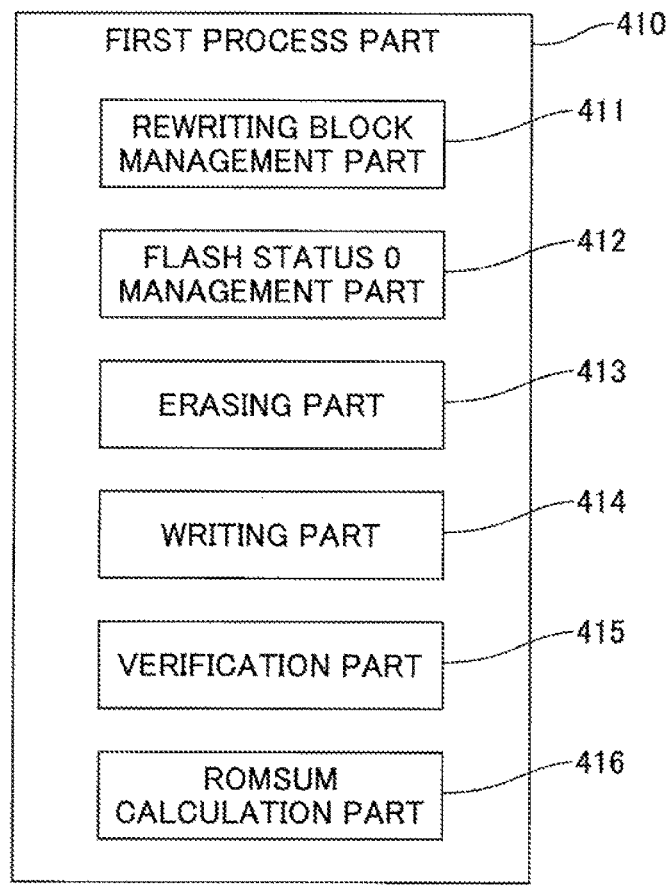
FIG. 4A illustrates a functional configuration of a first process part.
Figure 4B:
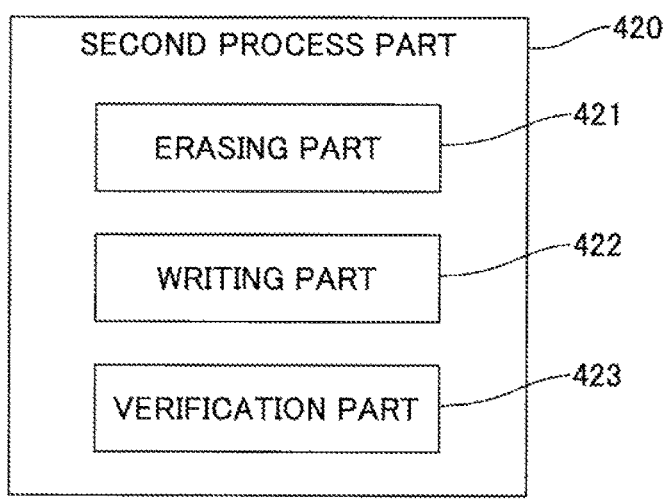
FIG. 4B illustrates a functional configuration of a second process part.

FIGS. 4A and 4B illustrate a functional configuration of the first and second process parts, respectively. FIG. 4A illustrates a functional configuration of the first process part 410. As shown in FIG. 4A, the first process part 410 has a rewriting block management part 411, a FLASH status 0 management part 412, an erasing part 413, a writing part 414, verification part 415 and a ROMSUM calculation part 416.

The rewriting block management part 411 manages the blocks to be rewritten. The FLASH status 0 management part 412 manages the data written in the FLASH status 0 area. The FLASH status 0 management part 412 determines that a rewriting process has been completed when the code "0x55AA . . . " that is the rewriting completion code is written in the FLASH status 0 area 200_0A. On the other hand, when data other than the rewriting completion code is written in the FLASH status 0 area 200_0A, the FLASH status 0 management part 412 determines that it is during a rewriting process (i.e., the rewriting process has not been completed).

The erasing part 413 erases the data written in each block in the rewriting process. As a result of the erasing part 413 erasing the data, the FLASH status 0 area 200_0A of the block 0 comes to have data "0xFFFF . . . ". Also, the area 200_0B of the block 0 and the areas 200_1 to 200_n of the blocks 1 to n each come to have data "0xFFFF . . . ".

The writing part 414 carries out writing on the block 0 to the block n in sequence in the rewriting process by using the user program for rewriting 171 supplied by the rewriting apparatus 160. In detail, to the area 200_0B of the block 0 and the area 200_1 of the block 1 to the area 200_n of the block n, the program body recorded in the body area 302 of the user program for rewriting 171 is written after being divided into the corresponding divisions, in sequence.

Note that, when the writing part 414 carries out a rewriting process on the block 0, it does not carry out writing on the FLASH status 0 area 200_0A. After the writing part 414 carries out a rewriting process on the block n and the ROMSUM calculation part 416 carries out a ROMSUM calculation, the writing part 414 carries out writing on the FLASH status 0 area 200_0A. Thus, the rewriting code "0x55AA . . . " recorded in the rewriting code area 301 of the user program for rewriting 171 is written in the FLASH status 0 area 200_0A, after the ROMSUM calculation is carried out.

The verification part 415 carries out verification on the blocks on which the writing part 414 has carried out the writing, and confirms whether the thus written data includes an error. The verification part 415 carries out verification on each block after the writing on the block is completed.

Note that, when the verification part 415 carries out verification on the block 0, the verification part 415 excludes the data written in the FLASH status 0 area 200_0A of the block 0 from the data to be verified. In other words, the verification part 415 carries out verification on the data written in the area 200_0B of the block 0 at this time.

FIG. 4B illustrates a functional configuration of the second process part 420. As shown in FIG. 4B, the second process part 420 includes an erasing part 421, a writing part 422 and a verification part 423. Note that, it is also possible that the second process part 420 further includes a rewriting block management part and a ROMSUM calculation part.

The erasing part 421 erases the data written in each block in a rewriting process. As a result of the erasing part 421 erasing the data, the FLASH status 0 area 200_0A of the block comes to have data "0xFFFF . . . ". Also, the area 200_0B of the block 0 and the areas 200_1 to 200_n of the blocks 1 to n each come to have data "0xFFFF . . . ".

The writing part 422 carries out writing on the blocks 0 to n in sequence in a rewriting process by using the user program for rewriting 171 supplied by the rewriting apparatus 160. In detail, the writing part 422 writes the rewriting code recorded in the rewriting code area 301 of the user program for rewriting 171 in the FLASH status 0 area 200_0A. Also, the writing part 422 writes the program body recorded in the body area 302 of the user program for rewriting 171 in the area 200_0B of the block 0 and the area 200_1 of the block 1 to the area 200_n of the block n after being divided into the corresponding divisions, in sequence.

The verification part 423 carries out verification on the blocks on which the writing part 422 has carried out the writing, and confirms whether the thus written data includes an error. The verification part 423 carries out verification on each block after the writing on the block is completed.

<(5) Rewriting Process by First and Second Rewriting Programs>

Next, a rewriting process carried out by the first and second rewriting programs 111 and 112 will be described. Note that, before a rewriting process carried out by the first and second rewriting programs 111 and 112 according to the first embodiment is described, a rewriting process carried out by first and second rewriting programs in the related art will be described first for comparison. Note that, the first and second rewriting programs in the related art will be assumed to be stored in a flash ROM configured as shown in FIG. 2 installed in a microcomputer apparatus configured as shown in FIG. 1. However, in order to positively distinguish from the microcomputer apparatus 100 having the first and second rewriting programs 111 and 112 according to the first embodiment, the microcomputer apparatus having the first and second rewriting programs in the related art will be referred to as a microcomputer apparatus 500.

<(5-1) Rewriting Process by First Rewriting Program in Related Art>

Figure 5A:
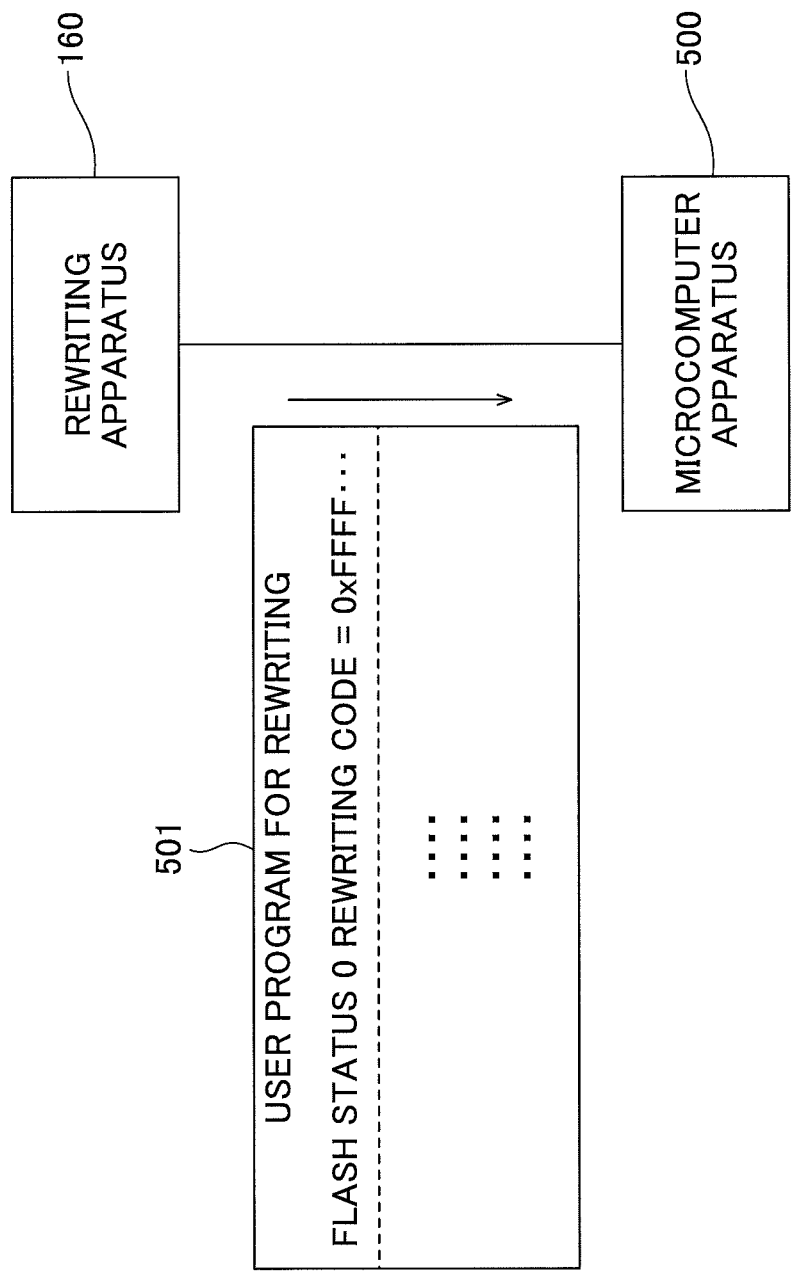
FIGS. 5A and 5B illustrate a rewriting process carried out by a first rewriting program in the related art.
Figure 5B:
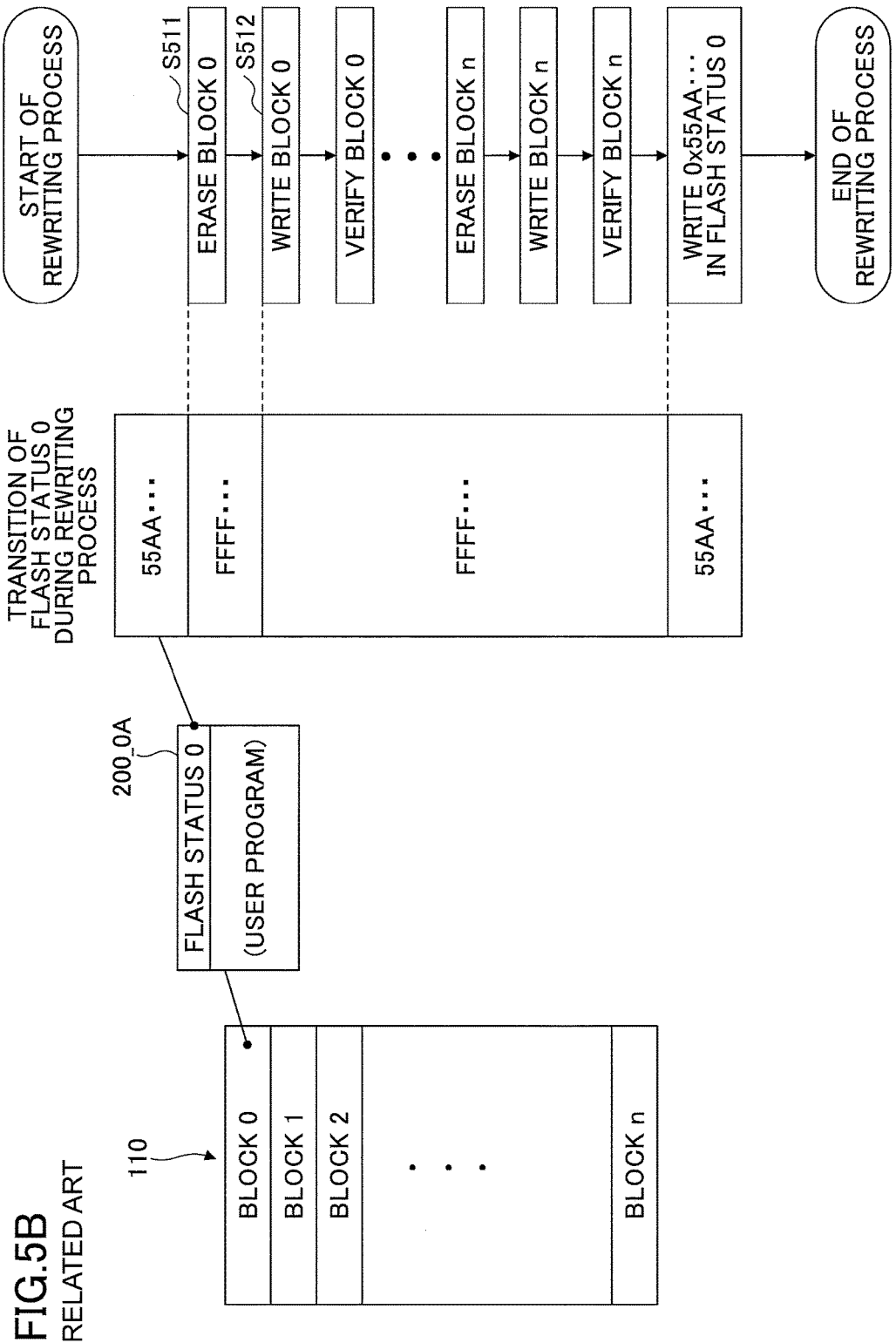

FIGS. 5A and 5B illustrate a rewriting process carried out by the first rewriting program in the related art (a unique rewriting program provided by an OEM or the like). As shown in FIG. 5A, as a result of the rewriting apparatus 160 being connected to the microcomputer apparatus 500, a user program for rewriting 501 is supplied to the microcomputer apparatus 500. In the user program for rewriting 501 supplied by the microcomputer apparatus 500, data "0xFFFF . . . " is recorded as a rewriting code to be written in the FLASH status 0 area 200_0A.

The first rewriting program in the related art carries out a rewriting process on the block 0 to the block n in sequence. In this case, it is necessary that a code to be written in the FLASH status 0 area 200_0A of the block 0 first is a code other than the rewriting completion code "0x55AA . . . ". In the example of FIG. 5A, as a code other than the rewriting completion code "0x55AA . . . ", data "0xFFFF . . . " is written in the FLASH status 0 area 200_0A of the block 0 first.

FIG. 5B illustrates a transition of the data written in the FLASH status 0 area 200_0A of the block 0 of the flash ROM 110 during a rewriting process in a manner of associating it with the rewriting process operations. As shown in FIG. 5B, immediately after the start of the rewriting process, the FLASH status 0 area 200_0A has the rewriting completion code "0x55AA . . . " (in FIG. 5B, shown as "55AA . . . ") that has been written there.

First, erasing is carried out on the block 0 (step S511). As a result, the data written in the FLASH status 0 area 200_0A transitions into data "0xFFFF . . . " (in FIG. 5B, shown as "FFFF . . . ")

Then, writing is carried out on the block 0 (step S512). As a result, data "0xFFFF . . . " recorded in a rewriting code area of the user program for rewriting 501 is written in the FLASH status 0 area 200_0A.

Thereafter, from verification of the block 0 to verification of the block n, the data of the FLASH status 0 area 200_0A is kept unchanged as the data "0xFFFF . . . ". After the completion of the verification of the block n, the first rewriting program in the related art determines that the rewriting process of the respective blocks has been completed, and writes the rewriting completion code "0x55AA . . . " in the FLASH status 0 area 200_0A. Thus, the data of the FLASH status 0 area 200_0A transitions into the code "0x55AA . . . ".

<(5-2) Rewriting Process by Second Rewriting Program in Related Art>

Figure 6A:
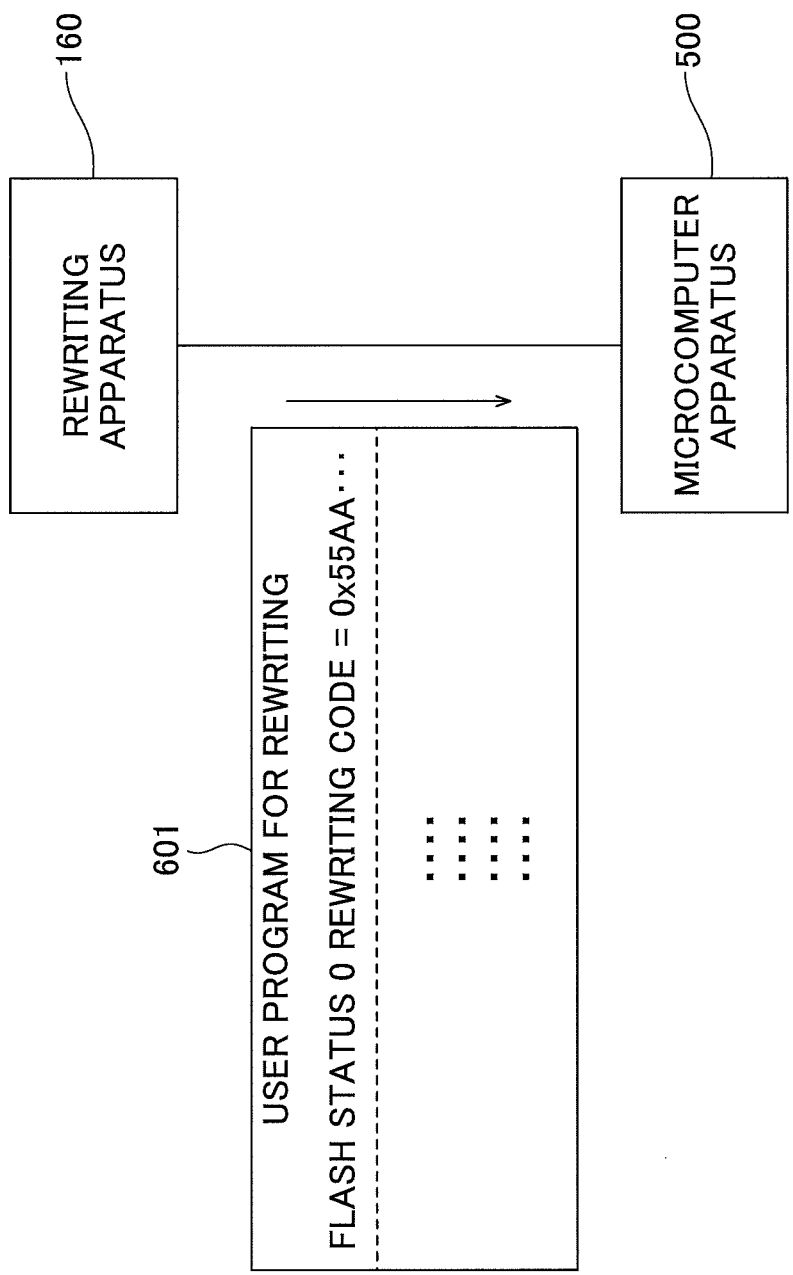
FIGS. 6A and 6B illustrate a rewriting process carried out by a second rewriting program in the related art.
Figure 6B:
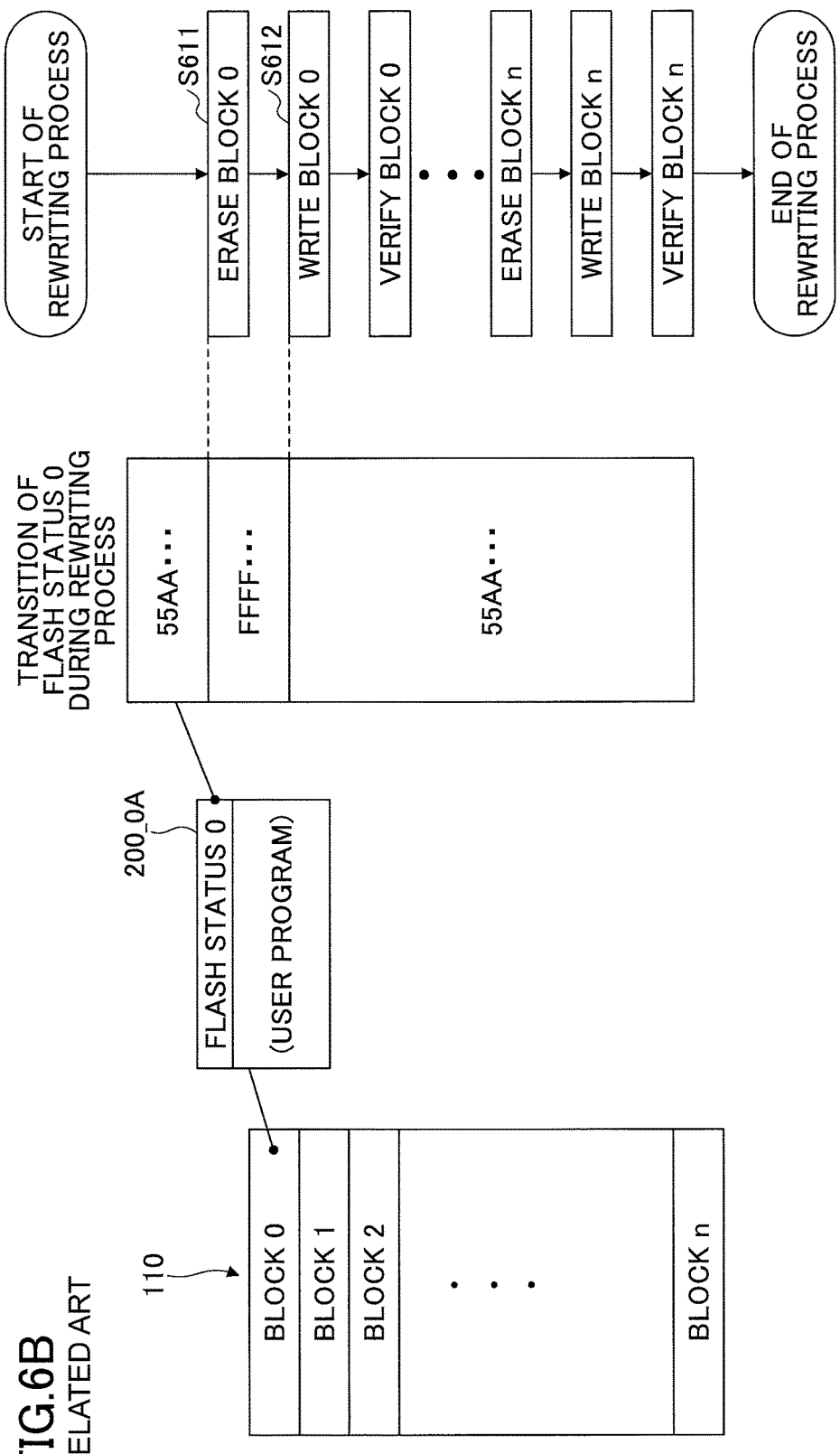

FIGS. 6A and 6B illustrate a rewriting process carried out by the second rewriting program in the related art (a general-purpose rewriting program provided by a microcomputer manufacturer or the like). As shown in FIG. 6A, as a result of the rewriting apparatus 160 being connected to the microcomputer apparatus 500, a user program for rewriting 601 is supplied to the microcomputer apparatus 500. The second rewriting program in the related art carries out a rewriting process on each block to be rewritten regardless of the data of the FLASH status 0 area 200_0A. Therefore, even if data other than the code "0x55AA . . . " is not written in the FLASH status 0 area 200_0A (i.e., even if the code "0x55AA . . . " is written there), a rewriting process on each block is carried out. However, after the completion of the rewriting process, the rewriting completion code "0x55AA . . . " needs to be written in the FLASH status 0 area 200_0A. Therefore, as shown in FIG. 6A, the code "0x55AA . . . " is recorded in the rewriting code area of the user program for rewriting 601 as the rewriting code to be written in the FLASH status 0 area 200_0A.

FIG. 6B illustrates a transition of the data written in the FLASH status 0 area 200_0A of the block 0 of the flash ROM 110 during a rewriting process in a manner of associating it with the rewriting process operations. As shown in FIG. 6B, immediately after the start of the rewriting process, the FLASH status 0 area 200_0A has the rewriting completion code "0x55AA . . . " (in FIG. 6B, shown as "55AA . . . ") that has been written there.

First, erasing is carried out on the block 0 (step S611). As a result, the data written in the FLASH status 0 area 200_0A transitions into data "0xFFFF . . . " (in FIG. 6B, shown as "FFFF . . . ").

Further, writing is carried out on the block 0 (step S612). As a result, the code "0x55AA . . . " recorded in the rewriting code area of the user program for rewriting 601 is written in the FLASH status 0 area 200_0A.

Thereafter, from verification of the block 0 to verification of the block n, the data of the FLASH status 0 area 200_0A is kept unchanged as the code "0x55AA . . . ". As a result, at the time when the verification of the block n has been completed, the rewriting completion code "0x55AA . . . " (in FIG. 6B, shown as "55AA . . . ") that has been written as mentioned above is present in the FLASH status 0 area 200_0A.

Thus, in the related art, it is necessary to use the user programs for rewriting (501 and 601) having the different rewriting codes between a rewriting process by using the first rewriting program and a rewriting process by using the second rewriting program. In other words, in the related art, different user programs for rewriting are needed between a rewriting program that controls a rewriting process based on the data of the FLASH status 0 area and a rewriting program that performs a rewriting process regardless of the data of the FLASH status 0 area. Therefore, in the related art, the user's managing load of managing user programs for rewriting may be heavy. Note that, for example, Japanese Laid-Open Patent Application No. 2008-165729 discloses a rewriting program that controls a rewriting process based on the data of the FLASH status 0 area. According to Japanese Laid-Open Patent Application No. 2008-165729, such a control is made that, when it is determined that the data of the FLASH status 0 area is other than the code "0x55AA . . . ", it is determined that a rewriting process has failed, and the rewriting process is carried out again.

In contrast thereto, the first rewriting program 111 according to the first embodiment enables sharing a user program for rewriting between the first and second rewriting programs 111 and 112.

Now, a rewriting process by the first and second rewriting programs 111 and 112 according to the first embodiment will be described.

<(5-3) Rewriting Process of First Rewriting Program>

Figure 7A:
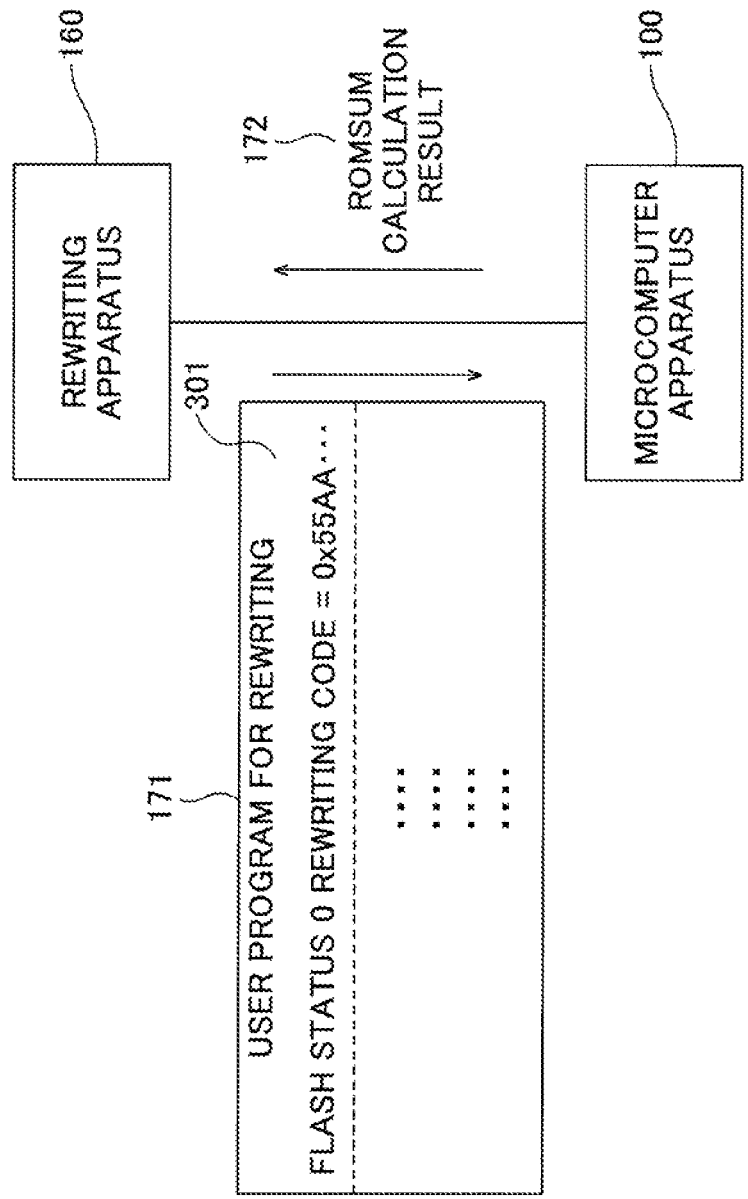
FIGS. 7A and 7B illustrate a rewriting process carried out by a first rewriting program according to a first embodiment.
Figure 7B:
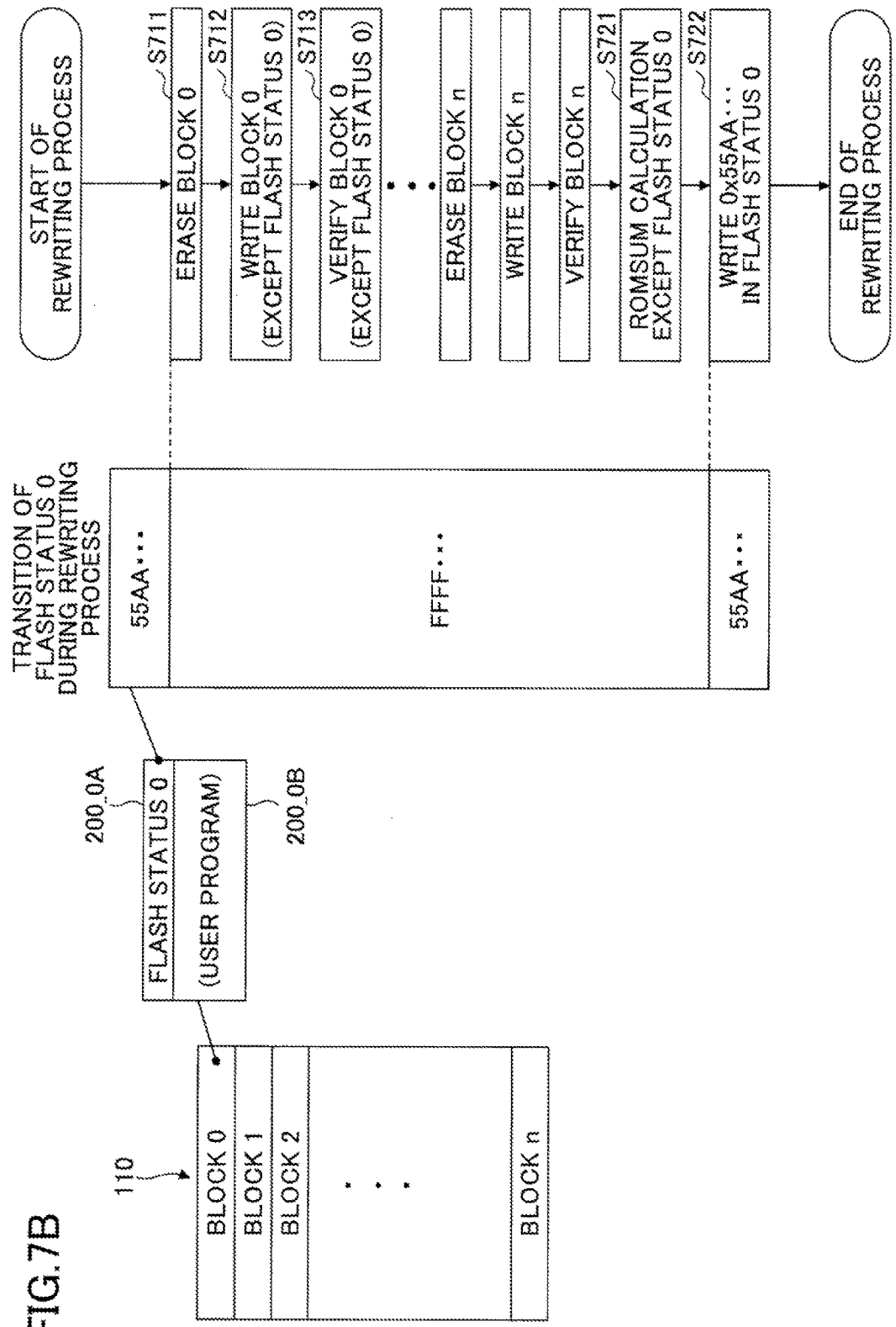

First, a rewriting process by the first rewriting program 111 according to the first embodiment will be described. FIGS. 7A and 7B illustrate a rewriting process carried out by the first rewriting program 111 according to the first embodiment. As shown in FIG. 7A, as a result of the rewriting apparatus 160 being connected to the microcomputer apparatus 100, the user program for rewriting 171 is supplied to the microcomputer apparatus 100. As described above, the code "0x55AA . . . " is recorded in the rewriting code area 301 of the user program for rewriting 171 supplied to the microcomputer apparatus 100 as the rewriting code to be written in the FLASH status 0 area 200_0A.

FIG. 7B illustrates a transition of the data written in the FLASH status 0 area 200_0A of the block 0 of the flash ROM 110 during a rewriting process in a manner of associating it with operations in the rewriting process. As shown in FIG. 7B, immediately after the start of the rewriting process, the FLASH status 0 area 200_0A has the rewriting completion code "0x55AA . . . " that has been written there.

First, erasing on the block 0 is carried out (step S711), and thus, the data written in the FLASH status 0 area 200_0A is erased. As a result, the data of the FLASH status 0 area 200_0A transitions to data "0xFFFF . . . ".

Then, writing on the block 0 is carried out (step S712). At this time, the writing part 414 carries out writing on the area other than the FLASH status 0 area 200_0A, and does not carry out writing on the FLASH status 0 area 200_0A.

Therefore, even after the completion of the writing on the block 0, the data of the FLASH status 0 area 200_0A is left unchanged as the data "0xFFFF . . . ". Therefore, the first process part 410 can continue the rewriting process on the remaining blocks thereafter.

Then, verification on the block 0 is carried out (step S713). At this time, the verification part 415 carries out verification on the area 200_0B not on the FLASH status 0 area 200_0A. Although the writing code to be written in the FLASH status 0 area 200_0A is the code "0x55AA . . . " (see the rewriting code area 301 of FIG. 7A), no writing is carried out on the FLASH status 0 area 200_0A in step S712 as mentioned above. Therefore, if verification were carried out on the entirety of the block 0 including the FLASH status 0 area 200_0A, an error would occur. However, as described above, the data of the FLASH status 0 area 200_0A is excluded from the data to be verified. Thus, no error occurs in step S713.

Thereafter, the rewriting process is carried out on the remaining blocks 1 to n. Then, after verification on the block n is finished, the ROMSUM calculation part 416 carries out a ROMSUM calculation (step S721). At this time, the ROMSUM calculation part 416 carries out a ROMSUM calculation on the areas other than the FLASH status 0 area 200_0A (also the rewriting apparatus 160 carries out a SUM calculation except the rewriting code to be written in the FLASH status 0 area 200_0A, correspondingly).

The rewriting code to be written in the FLASH status 0 area 200_0A is the code "0x55AA . . . " as mentioned above. However, at this time point, no writing on the FLASH status 0 area 200_0A has been carried out. Therefore, if a ROMSUM calculation were carried out on the entirety of the blocks 0 to n, the ROMSUM calculation result 172 would not be coincident with the SUM calculation result, and an error would occur. However, according to the first embodiment, as described above, the FLASH status 0 area 200_0A is excluded from the data on which the ROMSUM calculation is carried out (also the rewriting apparatus 160 carries out a SUM calculation except the rewriting code, correspondingly). Therefore, no inconsistency occurs between the ROMSUM calculation result 172 and the SUM calculation result, i.e., the ROMSUM calculation result 172 and the SUM calculation result are consistent with one another.

After the ROMSUM calculation is completed, the writing part 414 carries out writing on the FLASH status 0 area 200_0A (step S722). Thus, the rewriting code "0x55AA . . . " recorded in the rewriting code area 301 of the user program for rewriting 171 is written in the FLASH status 0 area 200_0A.

Thus, writing on the FLASH status 0 area 200_0A is carried out at the end. Therefore, there remain no areas on which writing is carried out thereafter. Thus, the writing on the FLASH status 0 area has no influence on the subsequent rewriting process. In other words, it is possible to avoid an influence on a rewriting process after code is written in the FLASH status 0 area.

FIG. 8 schematically illustrates a ROMSUM calculation process by the ROMSUM calculation part 416 and a SUM calculation process by the rewriting apparatus 160. As shown in FIG. 8, the ROMSUM calculation part 416 carries out a ROMSUM calculation on the data written in the area 200_0B of the block 0, the area 200_1 of the block 1, the area 200_2 of the block 2, . . . , and the area 200_n of the block n, respectively. Correspondingly, the rewriting apparatus 160 carries out a SUM calculation on the program body recorded in the body area 302 of the user program for rewriting 171.

Therefore, when writing by the first rewriting program 111 has been properly carried out, the ROMSUM calculation result 172 and the SUM calculation result are coincident with one another.

<(5-4) Rewriting Process by Second Rewriting Program>

Next, a rewriting process by the second rewriting program 112 according to the first embodiment will be described. The second rewriting program 112 according to the first embodiment is the same as the second rewriting program in the related art described above. Therefore, how the second rewriting program 112 according to the first embodiment properly operates even when using the same user program for rewriting that the first rewriting program 111 according to the first embodiment uses in a rewriting process will now be described.

Figure 9B:
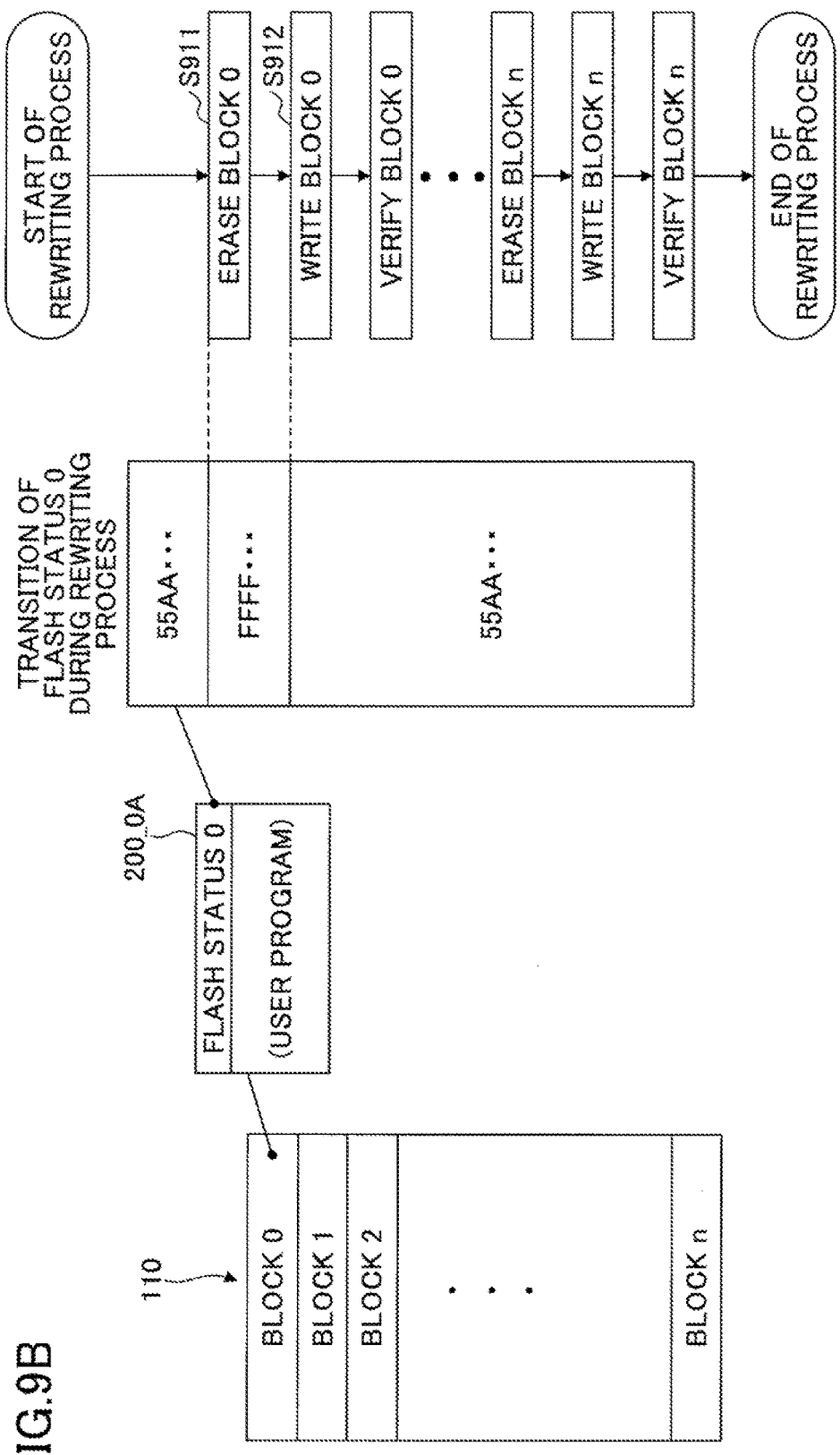

FIGS. 9A and 9B illustrate a rewriting process by the second rewriting program 112 according to the first embodiment. As shown in FIG. 9A, as a result of the rewriting apparatus 160 being connected to the microcomputer apparatus 100, the user program for rewriting 171 is supplied to the microcomputer apparatus 100. The user program for rewriting 171 thus supplied to the microcomputer apparatus 100 is the same as the user program for rewriting 171 supplied to the microcomputer apparatus 100 in FIG. 7A.

FIG. 9B illustrates a transition of the data written in the FLASH status 0 area 200_0A of the block 0 of the flash ROM 110 during a rewriting process, in a manner of associating it with operations in the rewriting process. As shown in FIG. 9B, immediately after the start of the rewriting process, the FLASH status 0 area 200_0A has the rewriting completion code "0x55AA . . . " that has been written there.

First, erasing on the block 0 is carried out (step S911), and thus, the data written in the FLASH status 0 area 200_0A is erased. As a result, the data of the FLASH status 0 area 200_0A transitions into data "0xFFFF . . . ".

Further, writing on the block 0 is carried out (step S912). Thus, the rewriting code "0x55AA . . . " recorded in the rewriting code area 301 of the user program for rewriting 171 is written in the FLASH status 0 area 200_0A.

Thereafter, from verification of the block 0 to verification of the block n, the data of the FLASH status 0 area 200_0A is kept unchanged as "0x55AA . . . ". As a result, at the time point when the verification of the block n has been completed, the FLASH status 0 area 200_0A still has the rewriting completion code "0x55AA . . . " that has been written there as mentioned above.

Thus, according to the first embodiment, it is possible to use the same user program for rewriting 171 between a rewriting process using the first rewriting program 111 according to the first embodiment and a rewriting process using the second rewriting program 112. In other words, it is possible to use the same user program for rewriting between a rewriting program controlling a rewriting process based on the data of the FLASH status 0 area and a rewriting program carrying out a rewriting process regardless of the data of the FLASH status 0 area. As a result, it is possible to reduce the managing load of the user who manages user programs for rewriting.

<(6) Summary of First Embodiment>

As can be seen from the above description, the first rewriting program 111 according to the first embodiment has features (i) and (ii) below.

(i) It does not carry out writing on the FLASH status 0 area 200_0A of the block 0 in a rewriting process on the block 0.

(ii) It carries out writing on the FLASH status 0 area 200_0A of the block 0 based on the code (the code to be written in the FLASH status 0 area) recorded in the user program for rewriting 171 after a rewriting process on the block n.

By thus carrying out writing on the FLASH status 0 area at the end, it is possible to remove the influence on a rewriting process after the code is written in the FLASH status 0 area. As a result, it is possible to use the same code to be written in the FLASH status 0 area between the respective user programs for rewriting used for the first and second rewriting programs 111 and 112, and thus, it is possible to share the same user program for rewriting 171 between the first and second rewriting programs 111 and 112.

As a result, it is possible to reduce the load of the user who manages new user programs for rewriting.

The first rewriting program 111 according to the first embodiment further has features (iii) and (iv).

(iii) It excludes the data of the FLASH status 0 area 200_0A when the verification part 415 carries out verification on the block 0.

(iv) It excludes the data of the FLASH status 0 area 200_0A when the ROMSUM calculation part 416 carries out a ROMSUM calculation.

As a result, even when the user program for rewriting 171 is enabled to be shared between the first and second rewriting programs 111 and 112, the first rewriting program 111 can properly carry out verification on the respective blocks and a ROMSUM calculation throughout the blocks. Thus, it is possible to positively detect a writing error, if any.

Second Embodiment

In the first embodiment, a ROMSUM calculation is carried out excluding the data of the FLASH status 0 area 200_0A of the block 0. In contrast thereto, according to a second embodiment, before carrying out erasing on the block 0, the data of the FLASH status 0 area 200_0A is stored in the RAM 120. Then, after the completion of a rewriting process on the block n, a ROMSUM calculation is carried out using the data thus stored in the RAM 120. Below, the second embodiment will be described. Note that the description will be made focusing on the differences from the first embodiment.

<(1) Rewriting Process by First Rewriting Program>

Figure 10B:
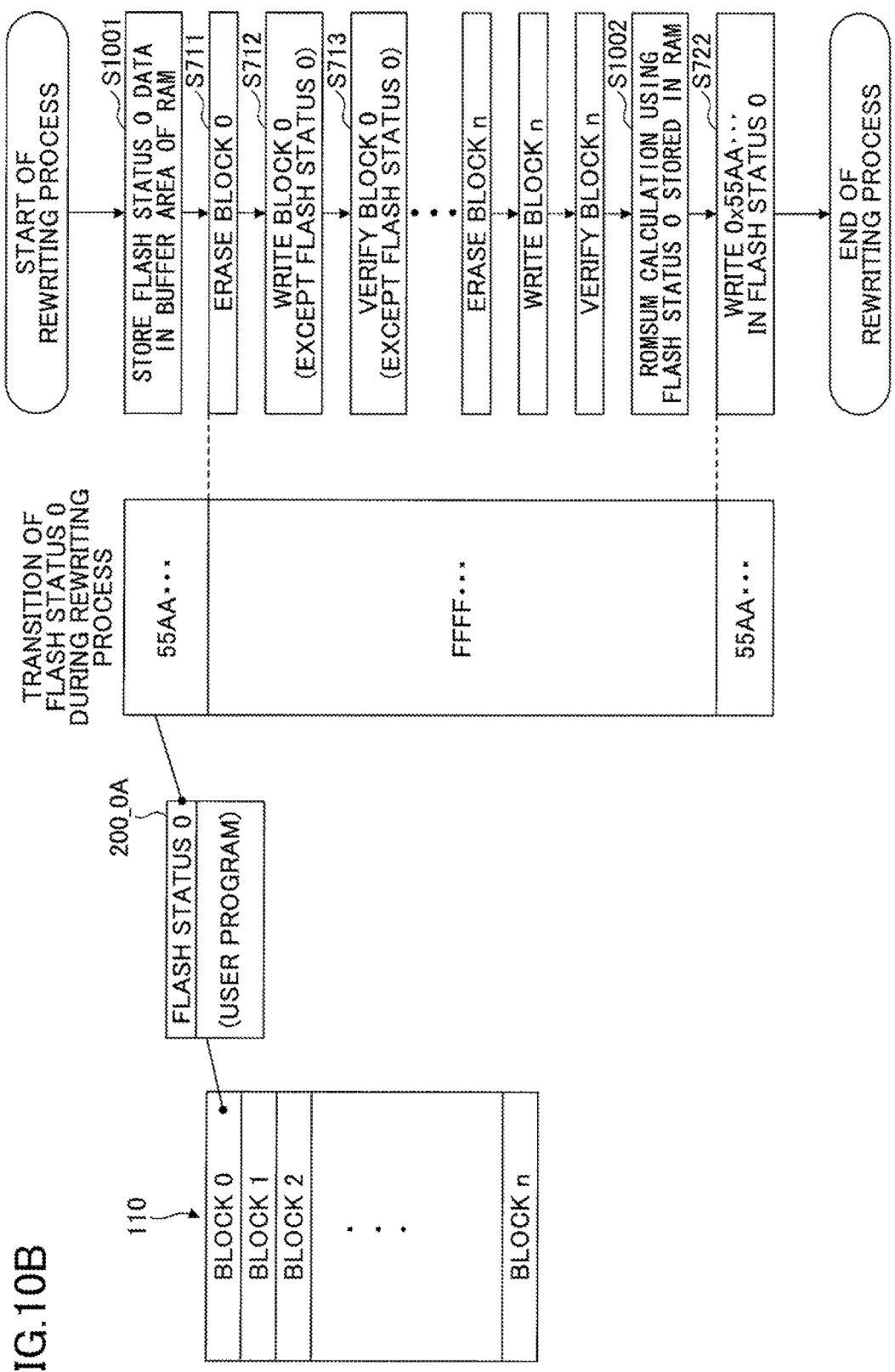

FIGS. 10A and 10B illustrate a rewriting process carried out by the first rewriting program 111 according to the second embodiment. As shown in FIG. 10A, as a result of the rewriting apparatus 160 being connected to the microcomputer apparatus 100, the user program for rewriting 171 is supplied to the microcomputer apparatus 100.

FIG. 10B illustrates a transition of the data written in the FLASH status 0 area 200_0A of the block 0 of the flash ROM 110 during a rewriting process, in a manner of associating it with operations in the rewriting process. As shown in FIG. 10B, immediately after the start of the rewriting process, the FLASH status 0 area 200_0A has the rewriting completion code "0x55AA . . . " that has been written there.

In step S1001, the FLASH status 0 management part 412 stores the data of the FLASH status 0 area 200_0A in a predetermined buffer area of the RAM 120.

Thereafter, erasing on the block 0 is carried out (step S711), and thus, the data written in the FLASH status 0 area 200_0A is erased. As a result, the data of the FLASH status 0 area 200_0A transitions into data "0xFFFF . . . ".

Further, writing on the block 0 is carried out (step S712). At this time, the writing part 414 carries out writing on the area other than the FLASH status 0 area 200_0A, and does not carry out writing on the FLASH status 0 area 200_0A.

Therefore, even after the completion of the writing on the block 0, the data of the FLASH status 0 area 200_0A is left unchanged as the data "0xFFFF . . . ". Therefore, the first process part 410 can continue writing on the remaining blocks thereafter.

From verification on the block 0 (step S713) to verification on the block n, the same process is carried out as that in the first embodiment described above using FIG. 7B.

After the verification on the block n is finished, the ROMSUM calculation part 416 carries out a ROMSUM calculation (step S1002). At this time, the ROMSUM calculation part 416 carries out a ROMSUM calculation on the areas other than the FLASH status 0 area 200_0A. Also, the ROMSUM calculation part 416 adds, to the thus acquired calculation result, the data that is the data of the FLASH status 0 area 200_0A before the erasing on the block 0 in step S711 and has been stored in the buffer area of the RAM 120 in step S1001. Also, the ROMSUM calculation part 416 outputs the summing result to the rewriting apparatus 160 as the ROMSUM calculation result 172.

After the completion of the ROMSUM calculation, the writing part 414 carries out writing on the FLASH status 0 area 200_0A (step S722). As a result, the code "0x55AA . . . " recorded in the rewriting code area 301 of the user program for rewriting 171 as the rewriting code is written in the FLASH status 0 area 200_0A.

<(2) Details of ROMSUM Calculation>

Figure 11:
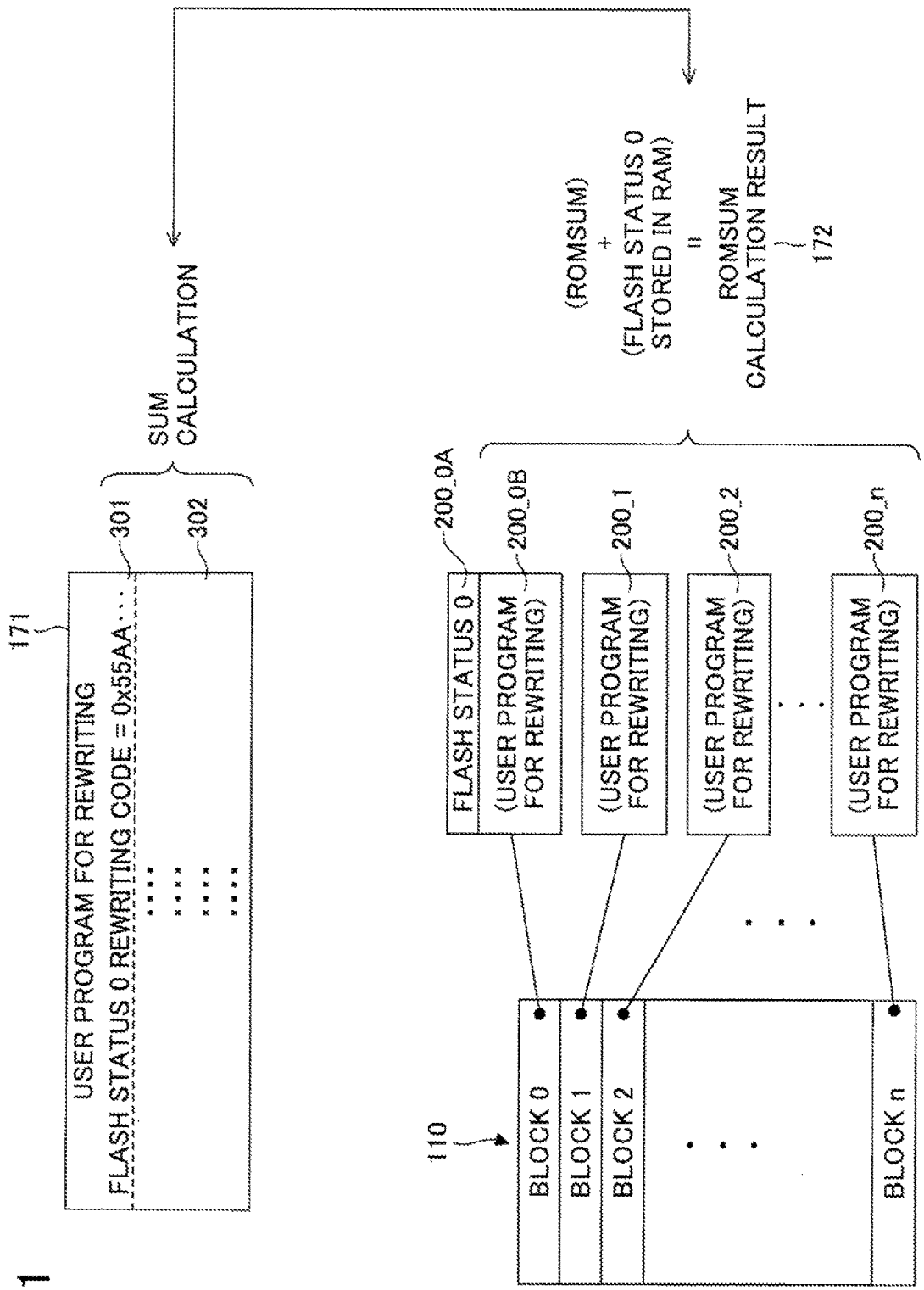
FIG. 11 schematically illustrates a ROMSUM calculation process by a ROMSUM calculation part and a SUM calculation process by a rewriting apparatus.

Next, the ROMSUM calculation (step S1002) will be described in detail. FIG. 11 schematically illustrates a ROMSUM calculation process (step S1002) by the ROMSUM calculation part 416 and a SUM calculation process by the rewriting apparatus 160.

As shown in FIG. 11, in order to determine whether the ROMSUM calculation result 172 is correct (i.e., there is no error in the corresponding rewriting process), the rewriting apparatus 160 carries out a SUM calculation based on the user program for rewriting 171. At this time, the rewriting apparatus 160 carries out a SUM calculation on the rewriting code area 301 where the rewriting code to be written in the FLASH status 0 area 200_0A is recorded and the body area 302 where the program body is recorded.

The ROMSUM calculation part 416 carries out a ROMSUM calculation on the area 200_0B of the block 0 not on the FLASH status 0 area 200_0A and the respective areas 200_1 to 200_n of the blocks 1 to n. Also, the ROMSUM calculation part 416 adds, to the thus acquired summing result, the data previously stored in the predetermined buffer area of the RAM 120 before the erasing is carried out on the block 0, and outputs the summing result to the rewriting apparatus 160 as the ROMSUM calculation result 172.

As described above, the SUM calculation result includes the rewriting code "0x55AA . . . " recorded in the rewriting code area 301 of the user program for rewriting 171 and the program body recorded in the body area 302 of the user program for rewriting 171. Correspondingly, the ROMSUM calculation result 172 includes the program body of the user program for rewriting 171 written in the respective areas 200_1B and 200_1 to 200_n of the block 0 to the block n in a manner of being divided into the corresponding n+1 divisions. The ROMSUM calculation result further includes the rewriting completion code="0x55AA . . . " written in the predetermined buffer area of the RAM 120. Note that, in the rewriting code area 301 of the user program for rewriting 171, the same code "0x55AA . . . " as the rewriting completion code "0x55AA . . . " is recorded as the rewriting code.

Therefore, after the rewriting process is properly completed, the SUM calculation result and the ROMSUM calculation result are coincident with one another. Thus, the rewriting apparatus 160 can carry out a SUM calculation including the rewriting code to be written in the FLASH status 0 area 200_0A. In other words, it is possible to carry out a SUM calculation without changing the calculation way even for the first rewriting program 111.

<(3) Summary of Second Embodiment>

As can be seen from the above description, the first rewriting program 111 according to the second embodiment has features (i) and (ii) below.

(i) It does not carry out writing on the FLASH status 0 area 200_0A of the block 0 in a rewriting process on the block 0.

(ii) It carries out writing on the FLASH status 0 area 200_0A of the block 0 based on the user program for rewriting 171 after a rewriting process on the block n.

By thus carrying out writing on the FLASH status 0 area at the end, it is possible to remove the influence on a rewriting process after a code is written in the FLASH status 0 area. As a result, it is possible to use the same code to be written in the FLASH status 0 area between the respective user programs for rewriting used for the first and second rewriting programs 111 and 112, and thus, it is possible to share the same user program for rewriting 171 between the first and second rewriting programs 111 and 112.

As a result, it is possible to reduce the load of the user who manages new user programs for rewriting.

The first rewriting program 111 according to the second embodiment further has features (iii) and (iv).

(iii) It excludes the data of the FLASH status 0 area 200_0A when the verification part 415 carries out verification on the block 0.

(iv) It excludes the data of the FLASH status 0 area 200_0A when the ROMSUM calculation part 416 carries out a ROMSUM calculation. Also, it adds the data stored in the predetermined buffer area of the ROM 120 before erasing on the block 0 to the calculation result, and outputs the addition result as the ROMSUM calculation result.

As a result, even when the user program for rewriting 171 is enabled to be shared between the first and second rewriting programs 111 and 112, the first rewriting program 111 can properly carry out verification on the respective blocks and a ROMSUM calculation throughout the blocks. Thus, it is possible to positively detect a writing error, if any. Also, the rewriting apparatus 160 can carry out a SUM calculation including the code to be written in the FLASH status 0 area 200_0A (the rewriting code), and thus, it is possible to carry out a SUM calculation without changing the calculation way even for the first rewriting program 111.

Note that, according to the second embodiment, the data of the FLASH status 0 area 200_0A is stored in the RAM 120. However, it is also possible that, for example, the rewriting code recorded in the rewriting code area 301 of the user program for rewriting 171 is stored in the RAM 120, instead.

Third Embodiment

According to the first and second embodiments, verification is carried out on the block 0 excluding the data of the FLASH status 0 area 200_0A. According to a third embodiment, in contrast thereto, verification is carried out on the block 0 using a fixed value. Below, the third embodiment will be described. Note that the description will be made focusing on the differences from the first and second embodiments.

<(1) Rewriting Process by First Rewriting Program>

Figure 12A:
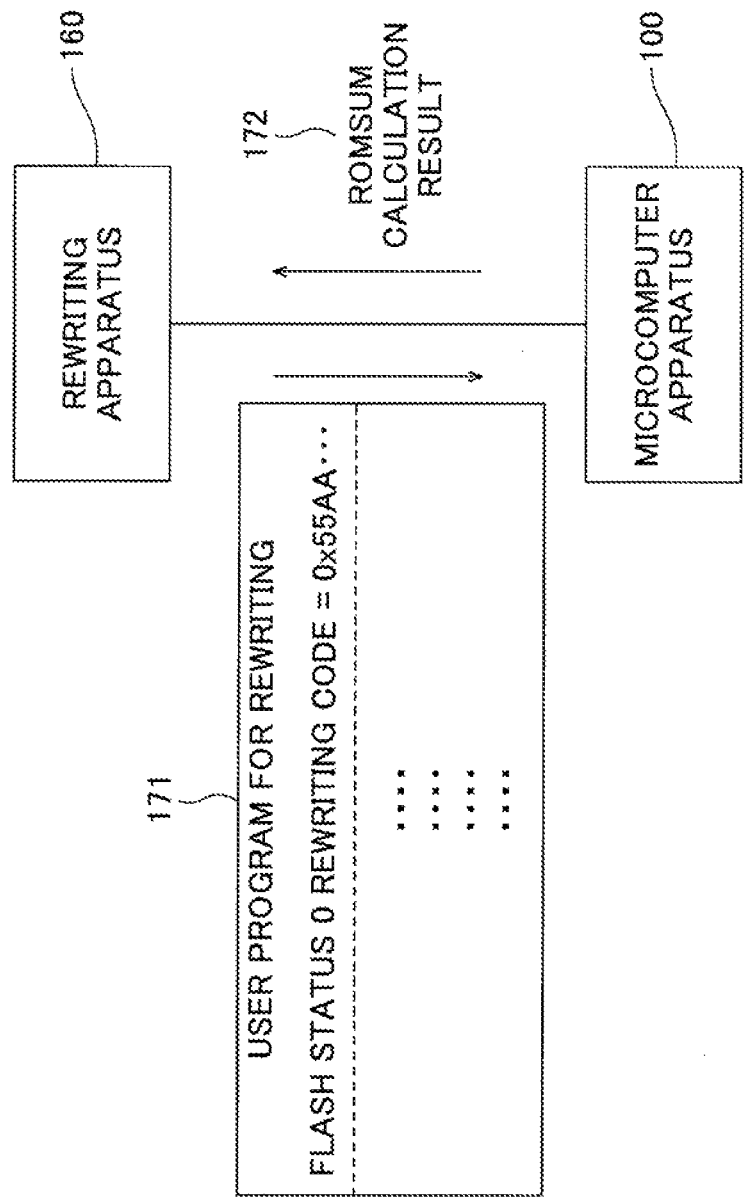

FIGS. 12A and 12B illustrate a rewriting process carried out by a first rewriting program 111 according to the third embodiment. As shown in FIG. 12A, as a result of the rewriting apparatus 160 being connected to the microcomputer apparatus 100, the user program for rewriting 171 is supplied to the microcomputer apparatus 100.

FIG. 12B illustrates a transition of the data written in the FLASH status 0 area 200_0A of the block 0 of the flash ROM 110 during a rewriting process, in a manner of associating it with operations in the rewriting process. As shown in FIG. 12B, immediately after the start of the rewriting process, the FLASH status 0 area 200_0A has the rewriting completion code "0x55AA . . . " that has been written there.

The first process part 410 carries out steps S1001, S711 and S712. Note that, step S1001 has been described above for the second embodiment using FIG. 10B, and thus, duplicate description will be omitted. Steps S711 and S712 have been described above for the first embodiment using FIG. 7B, and thus, duplicate description will be omitted.

In step S1201, the verification part 415 carries out verification on the block 0. At this time, the verification part 415 carries out verification on the entire block 0 including the FLASH status 0 area 200_0A.

Note that, although the code "0x55AA . . . " is a code to be written in the FLASH status 0 area 200_0A, no writing is carried out on the FLASH status 0 area 200_0A in step S712. In other words, the code "0x55AA . . . " to be written in the FLASH status 0 area 200_0A is not actually written in the FLASH status 0 area 200_0A in step S712. Therefore, an error would occur if verification were carried out on the entire block 0 in the standard way.

In order to avoid such an error, the verification is carried out on the FLASH status 0 area 200_0A using a fixed value ("0xFFFF . . . ") as a code to be written in the FLASH status 0 area 200_0A according to the third embodiment.

The data of the FLASH status 0 area 200_0A is data "0xFFFF . . . " because the erasing has been carried out on the block 0 (step S711). Therefore, when the erasing on the block 0 is carried out properly and the writing on the area 200_0B of the block 0 not on the FLASH status 0 area 200_0A is carried out properly, no error occurs in the verification on the block 0. This is because the data actually written in the FLASH status 0 area 200_0A and the data to be written in the FLASH status 0 area 200_0A are thus coincident with one another as "0xFFFF . . . ".

The process carried out after the completion of the verification on the block 0 in step S1201 has been already described above using FIG. 7B or 10B, and thus, duplicate description will be omitted.

<(2) Details of Verification on Block 0>

Figure 13:
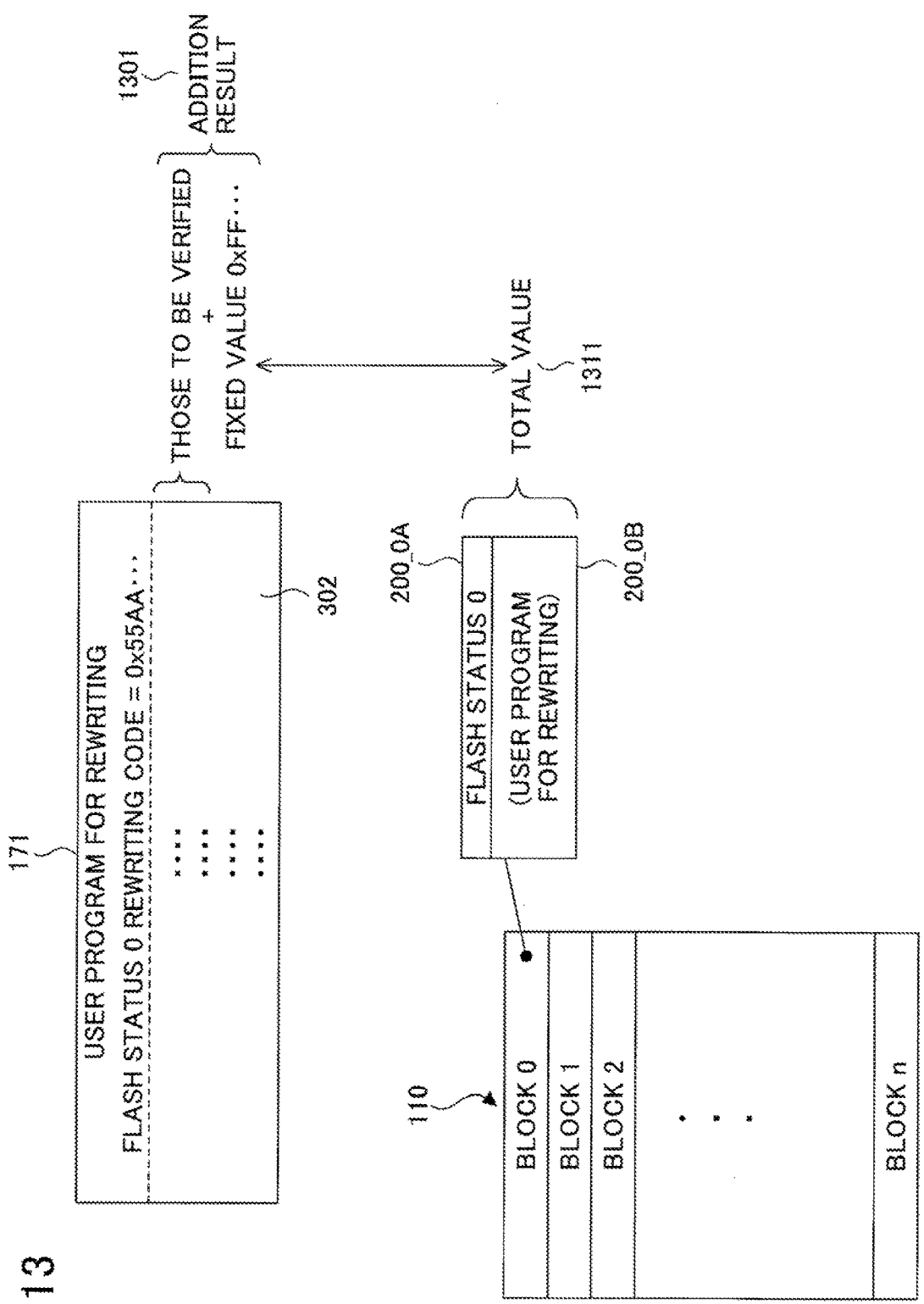
FIG. 13 illustrates verification carried out by the first rewriting program according to the third embodiment.

Next, the verification on the block 0 (step S1201) will be described in detail. FIG. 13 illustrates details of the verification on the block 0.

As shown in FIG. 13, the verification part 415 adds the fixed value to the total value of such a part of the program body recorded in the body area 302 of the user program for rewriting 171 as to be written in the area 200_0B of the block 0 after being divided. Note that the fixed value is the data "0xFFFF . . . ". The verification part 415 holds the addition result 1301.

The verification part 415 calculates the total value 1311 of the data written in the FLASH status 0 area 200_0A and the other area 200_0B of the block 0 at the time point when the writing on the block 0 by the writing part 414 has been finished. The verification part 415 then compares the previously held addition result 1301 with the total value 1311, and determines whether the comparison result is that they are coincident with one another.

Note that the data of the FLASH status 0 area 200_0A is the data "0xFFFF . . . " at the time point when the writing on the block 0 by the writing part 414 has been finished. This is because the erasing is carried out on the block 0 before the writing is carried out, and also, the result of the erasing on the block 0 remains because the writing part 414 has not carried out writing on the FLASH status 0 area 200_0A yet at the time of the writing on the block 0 in step S712. On the other hand, on the area 200_0B of the block 0 of the block 0 other than the FLASH status 0 area 200_0A, the corresponding part (division) of the program body of the user program for rewriting 171 has been written.

Therefore, when the erasing on the block 0 by the erasing part 413 has been properly carried out and the writing on the area 200_0B of the block 0 other than the FLASH status 0 area 200_0A by the writing part 414 properly is carried out, no error occurs. In other words, in the verification on the block 0 according to the third embodiment, it is possible to determine whether the erasing on the block 0 has been properly carried out and the writing on the area 200_0B of the block 0 other than the FLASH status 0 area 200_0A has been properly carried out.

<(3) Summary of Third Embodiment>

As can be seen from the above description, the first rewriting program 111 according to the third embodiment has features (i) and (ii) below.

(i) It does not carry out writing on the FLASH status 0 area 200_0A of the block 0 in a rewriting process on the block 0.

(ii) It carries out writing on the FLASH status 0 area 200_0A of the block 0 based on the user program for rewriting 171 after a rewriting process on the block n.

By thus carrying out writing on the FLASH status 0 area at the end, it is possible to remove the influence on a rewriting process after a code is written in the FLASH status 0 area. As a result, it is possible to use the same code to be written in the FLASH status 0 area between the respective user programs for rewriting used for the first and second rewriting programs 111 and 112, and thus, it is possible to share the same user program for rewriting 171 between the first and second rewriting programs 111 and 112.

As a result, it is possible to reduce the load of the user who manages new user programs for rewriting.

The first rewriting program 111 according to the third embodiment further has features (iii) and (iv).

(iii) The verification part 415 carries out verification regarding a fixed value as the data to be written in the FLASH status 0 area 200_0A when carrying out verification on the block 0.

(iv) When the ROMSUM calculation part 416 carries out a ROMSUM calculation, it excludes the data of the FLASH status 0 area 200_0A. Also, it adds the data stored in the predetermined buffer area of the ROM 120 before the erasing on the block 0 to the calculation result, and outputs the addition result as the ROMSUM calculation result.

As a result, even when the user program for rewriting 171 is enabled to be shared between the first and second rewriting programs 111 and 112, the first rewriting program 111 can properly carry out verification on the respective blocks and a ROMSUM calculation throughout the blocks. Thus, it is possible to positively detect a writing error, if any. Also, the first rewriting program 111 can properly carry out verification including the code to be written in the FLASH status 0 area 200_0A. Thus, it is possible to determine whether erasing has been properly carried out on the FLASH status 0 area.

Other Embodiments

According to the first to third embodiments, in a rewriting process by the first rewriting program 111, erasing on the block 0 is carried out first. However, it is not necessary that a process to be carried out first is erasing on the block 0. For example, it is also possible to write 0 in the FLASH status 0 area 200_0A before carrying out erasing on the block 0.

Concerning the third embodiment, the process of carrying out verification on the block 0 regarding a fixed value as the data to be written in the FLASH status 0 area has been described in combination with the second embodiment. However, it is also possible that the process of carrying out verification on the block 0 regarding a fixed value as the data to be written in the FLASH status 0 area is combined with the first embodiment.

According to the first to third embodiments, verification is carried out for each block. However, it is also possible to carry out verification for each address or each byte. For example, in the first and second embodiments, it is possible to carry out verification for each address or each byte on the areas other than the FLASH status 0 area 200_0A. In the third embodiment, it is possible that verification is carried out on the FLASH status 0 area 200_0A regarding a fixed value ("0xFFFF . . . ") as the data to be written in the FLASH status 0 area 200_0A whereas verification is carried out for each address or each byte on the areas other than the FLASH status 0 area 200_0A.

Thus, the microcomputer apparatuses, the program rewriting systems and the non-transitory computer-readable information recording media have been described in the embodiments. However, the present disclosure is not limited to such specific embodiments, variants thereof such as those of any combination with other elements may be made, and actual implementation modes may vary according to various circumstances.

According to the embodiments, it is possible to reduce the load of a user who manages new user programs for rewriting.

What is claimed is:

1. A microcomputer apparatus in which a user program stored in blocks of a flash ROM is rewritable based on contents of a user program for rewriting, the microcomputer apparatus comprising:
one or more processors configured to carry out
a first process of controlling, based on data of a FLASH status 0 area used to write a rewriting completion code included in a first block of the blocks of the flash ROM, a rewriting process including erasing, writing and verifying on the blocks of the flash ROM, and
a second process of carrying out the rewriting process including erasing, writing and verifying on the blocks of the flash ROM without regard to the data of the FLASH status 0 area, wherein
in the first process, the one or more processors are configured to, in the rewriting process on the first block of the blocks of the flash ROM, not carry out writing on the FLASH status 0 area, and the one or more processors are configured to, after carrying out the rewriting process on a last block of the blocks of the flash ROM, carry out writing on the FLASH status 0 area based on the contents of the user program for rewriting.

2. The microcomputer apparatus as claimed in claim 1, wherein
in the first process,
the one or more processors are configured to hold the data of the FLASH status 0 area before carrying out the rewriting process on the first block of the blocks of the flash ROM, and
the one or more processors are configured to calculate a sum of the data written in the blocks of the flash ROM using the held data after carrying out the rewriting process on the last block of the blocks of the flash ROM.

3. The microcomputer apparatus as claimed in claim 1, wherein
in the first process, the one or more processors are configured to carry out verifying on the first block of the blocks of the flash ROM using a predetermined fixed value as a code to be written in the FLASH status 0 area after carrying out writing on the first block of the blocks of the flash ROM.

4. The microcomputer apparatus as claimed in claim 2, wherein
in the first process, the one or more processors are configured to carry out verifying on the first block of the blocks of the flash ROM using a predetermined fixed value as a code to be written in the FLASH status 0 area after carrying out writing on the first block of the blocks of the flash ROM.

5. The microcomputer apparatus as claimed in claim 1, wherein
in the rewriting process, the one or more processors are configured to (i) erase the data written in the blocks of the flash ROM, (ii) thereafter write data recorded in the user program for rewriting in the blocks of the flash ROM, and (iii) thereafter verify the data written in the blocks of the flash ROM.

6. The microcomputer apparatus as claimed in claim 2, wherein
in the rewriting process, the one or more processors are configured to (i) erase the data written in the blocks of the flash ROM, (ii) thereafter write data recorded in the user program for rewriting in the blocks of the flash ROM, and (iii) thereafter verify the data written in the blocks of the flash ROM.

7. The microcomputer apparatus as claimed in claim 3, wherein
in the rewriting process, the one or more processors are configured to (i) erase the data written in the blocks of the flash ROM, (ii) thereafter write data recorded in the user program for rewriting in the blocks of the flash ROM, and (iii) thereafter verify the data written in the blocks of the flash ROM.

8. The microcomputer apparatus as claimed in claim 4, wherein
in the rewriting process, the one or more processors are configured to (i) erase the data written in the blocks of the flash ROM, (ii) thereafter write data recorded in the user program for rewriting in the blocks of the flash ROM, and (iii) thereafter verify the data written in the blocks of the flash ROM.

9. A program rewriting system comprising:
the microcomputer apparatus claimed in claim 1; and
a rewriting apparatus (1) supplying the user program for rewriting to the microcomputer apparatus, (2) sending an instruction to the microcomputer apparatus to cause the microcomputer apparatus to rewrite the user program stored in the flash ROM in the first process or the second process, and (3) determining, when the first process is used, whether the rewriting of the user program has been properly carried out based on a result of calculation of a sum of the data written in the blocks of the flash ROM sent from the microcomputer apparatus.

10. A program rewriting system comprising:
the microcomputer apparatus claimed in claim 2; and
a rewriting apparatus (1) supplying the user program for rewriting to the microcomputer apparatus, (2) sending an instruction to the microcomputer apparatus to cause the microcomputer apparatus to rewrite the user program stored in the flash ROM in the first process or the second process, and (3) determining, when the first process is used, whether the rewriting of the user program has been properly carried out based on a result of calculation of a sum of the data written in the blocks of the flash ROM sent from the microcomputer apparatus.

11. A program rewriting system comprising:
the microcomputer apparatus claimed in claim 3; and
a rewriting apparatus (1) supplying the user program for rewriting to the microcomputer apparatus, (2) sending an instruction to the microcomputer apparatus to cause the microcomputer apparatus to rewrite the user program stored in the flash ROM in the first process or the second process, and (3) determining, when the first process is used, whether the rewriting of the user program has been properly carried out based on a result of calculation of a sum of the data written in the blocks of the flash ROM sent from the microcomputer apparatus.

12. A program rewriting system comprising:
the microcomputer apparatus claimed in claim 4; and
a rewriting apparatus (1) supplying the user program for rewriting to the microcomputer apparatus, (2) sending an instruction to the microcomputer apparatus to cause the microcomputer apparatus to rewrite the user program stored in the flash ROM in the first process or the second process, and (3) determining, when the first process is used, whether the rewriting of the user program has been properly carried out based on a result of calculation of a sum of the data written in the blocks of the flash ROM sent from the microcomputer apparatus.

13. A non-transitory computer-readable information recording medium storing therein a first rewriting program and a second rewriting program for rewriting a user program stored in blocks of a flash ROM based on contents of a user program for rewriting, wherein
the first rewriting program is configured to cause one or more processors to control, based on data of a FLASH status 0 area used to write a rewriting completion code included in a first block of the blocks of the flash ROM, a rewriting process including erasing, writing and verifying on the blocks of the flash ROM, and
the second rewriting program is configured to cause the one or more processors to carry out the rewriting process including erasing, writing and verifying on the blocks of the flash ROM without regard to the data of the FLASH status 0 area, wherein the first rewriting program is configured to cause the one or more processors to, in the rewriting process on the first block of the hocks of the flash ROM, not carry out writing on the FLASH status 0 area, and the first rewriting program is configured to, after carrying out the rewriting process on a last block of the blocks of the flash ROM, cause the one or more processors to carry out writing on the FLASH status 0 area based on the contents of the user program for rewriting.

14. The non-transitory computer-readable information recording medium as claimed in claim 13, wherein the first rewriting program is configured to cause the one or more processors to hold the data of the FLASH status 0 area before carrying out the rewriting process on the first block of the blocks of the flash ROM, and calculate a sum of the data written in the blocks of the flash ROM using the held data after carrying out the rewriting process on the last block of the blocks of the flash ROM.

15. The non-transitory computer-readable information recording medium as claimed in claim 13, wherein the first rewriting program is configured to cause the one or more processors to carry out verifying on the first block of the blocks of the flash ROM using a predetermined fixed value as a code to be written in the FLASH status 0 area after carrying out writing on the first block of the blocks of the flash ROM.

16. The non-transitory computer-readable information recording medium as claimed in claim 14, wherein the first rewriting program is configured to cause the one or more processors to carry out verifying on the first block of the blocks of the flash ROM using a predetermined fixed value as a code to be written in the FLASH status 0 area after carrying out writing on the first block of the blocks of the flash ROM.

17. The non-transitory computer-readable information recording medium as claimed in claim 13, wherein in the rewriting process, the first or second rewriting program is configured to (i) cause the one or more processors to erase the data written in the blocks of the flash ROM, (ii) thereafter write data recorded in the user program for rewriting in the blocks of the flash ROM, and (iii) thereafter verify the data written in the blocks of the flash ROM.

18. The non-transitory computer-readable information recording medium as claimed in claim 14, wherein in the rewriting process, the first or second rewriting program is configured to (i) cause the one or more processors to erase the data written in the blocks of the flash ROM, (ii) thereafter write data recorded in the user program for rewriting in the blocks of the flash ROM, and (iii) thereafter verify the data written in the blocks of the flash ROM.

19. The non-transitory computer-readable information recording medium as claimed in claim 15, wherein in the rewriting process, the first or second rewriting program is configured to (i) cause the one or more processors to erase the data written in the blocks of the flash ROM, (ii) thereafter write data recorded in the user program for rewriting in the blocks of the flash ROM, and (iii) thereafter verify the data written in the blocks of the flash ROM.

20. The non-transitory computer-readable information recording medium as claimed in claim 16, wherein in the rewriting process, the first or second rewriting program is configured to (i) cause the one or more processors to erase the data written in the blocks of the flash ROM, (ii) thereafter write data recorded in the user program for rewriting in the blocks of the flash ROM, and (iii) thereafter verify the data written in the blocks of the flash ROM.

* * * * *